(12) United States Patent
Uesugi et al.

(10) Patent No.: US 9,704,882 B2
(45) Date of Patent: Jul. 11, 2017

(54) LOGIC CIRCUIT, PROCESSING UNIT, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Wataru Uesugi, Kanagawa (JP); Hikaru Tamura, Kanagawa (JP); Atsuo Isobe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/199,004

(22) Filed: Jun. 30, 2016

(65) Prior Publication Data

US 2017/0005658 A1 Jan. 5, 2017

Related U.S. Application Data

(63) Continuation of application No. 14/874,607, filed on Oct. 5, 2015, now Pat. No. 9,385,713.

(30) Foreign Application Priority Data

Oct. 10, 2014 (JP) .................. 2014-209506

(51) Int. Cl.
*H03K 19/00* (2006.01)
*H01L 27/12* (2006.01)
(Continued)

(52) U.S. Cl.
CPC ............ *H01L 27/1207* (2013.01); *G11C 7/04* (2013.01); *H01L 27/1255* (2013.01);
(Continued)

(58) Field of Classification Search
CPC . H01L 27/1207; H01L 27/1255; H01L 28/40; H01L 29/045; H01L 29/7849; H03K 19/0008; H03K 19/018514
See application file for complete search history.

(56) References Cited

U.S. PATENT DOCUMENTS 3,775,693 A 11/1973 Proebsting
4,797,576 A 1/1989 Asazawa
(Continued)

FOREIGN PATENT DOCUMENTS

CN 102668077 A 9/2012
EP 1737044 A 12/2006
(Continued)

OTHER PUBLICATIONS

Tamura.H et al., "Embedded SRAM and Cortex-M0 Core with Backup Circuits Using a 60-nm Crystalline Oxide Semiconductor for Power Gating", IEEE Cool Chips XVII, Apr. 14, 2014, p. 3pages.
(Continued)

*Primary Examiner* — Alexander H Taningco
*Assistant Examiner* — Kurtis R Bahr
(74) *Attorney, Agent, or Firm* — Fish & Richardson P.C.

(57) ABSTRACT

A retention circuit provided in a logic circuit enables power gating. The retention circuit includes a first terminal, a node, a capacitor, and first to third transistors. The first transistor controls electrical connection between the first terminal and an input terminal of the logic circuit. The second transistor controls electrical connection between an output terminal of the logic circuit and the node. The third transistor controls electrical connection between the node and the input terminal of the logic circuit. A gate of the first transistor is electrically connected to a gate of the second transistor. In a
(Continued)

data retention period, the node becomes electrically floating. The voltage of the node is held by the capacitor.

10 Claims, 23 Drawing Sheets

(51) Int. Cl.
    *H01L 49/02* (2006.01)
    *H01L 29/04* (2006.01)
    *H01L 29/78* (2006.01)
    *H03K 19/0185* (2006.01)
    *G11C 7/04* (2006.01)

(52) U.S. Cl.
    CPC .............. *H01L 28/40* (2013.01); *H01L 29/04* (2013.01); *H01L 29/045* (2013.01); *H01L 29/7849* (2013.01); *H03K 19/0008* (2013.01); *H03K 19/018514* (2013.01)

(56) References Cited

U.S. PATENT DOCUMENTS

| | | | |
|---|---|---|---|
| 4,800,303 | A | 1/1989 | Graham et al. |
| 5,039,883 | A | 8/1991 | On |
| 5,731,856 | A | 3/1998 | Kim et al. |
| 5,744,864 | A | 4/1998 | Cillessen et al. |
| 5,980,092 | A | 11/1999 | Merryman et al. |
| 6,049,883 | A | 4/2000 | Tjandrasuwita |
| 6,078,194 | A | 6/2000 | Lee |
| 6,204,695 | B1 | 3/2001 | Alfke et al. |
| 6,281,710 | B1 | 8/2001 | Poirier et al. |
| 6,294,274 | B1 | 9/2001 | Kawazoe et al. |
| 6,563,174 | B2 | 5/2003 | Kawasaki et al. |
| 6,573,754 | B2 | 6/2003 | Menczigar et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,076,748 | B2 | 7/2006 | Kapoor et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,539,915 | B1* | 5/2009 | Solt .................. G01R 31/31855 714/726 |
| 7,576,582 | B2 | 8/2009 | Lee et al. |
| 7,674,650 | B2 | 3/2010 | Akimoto et al. |
| 7,732,819 | B2 | 6/2010 | Akimoto et al. |
| 8,286,041 | B2 | 10/2012 | Kawasaki et al. |
| 8,362,538 | B2 | 1/2013 | Koyama et al. |
| 8,467,231 | B2 | 6/2013 | Matsuzaki et al. |
| 8,575,985 | B2 | 11/2013 | Ohmaru et al. |
| 8,593,856 | B2 | 11/2013 | Koyama et al. |
| 8,618,586 | B2 | 12/2013 | Koyama et al. |
| 8,705,267 | B2 | 4/2014 | Endo et al. |
| 8,773,906 | B2 | 7/2014 | Ohmaru |
| 8,792,288 | B1 | 7/2014 | Bartling et al. |
| 8,860,485 | B2 | 10/2014 | Kato et al. |
| 8,891,286 | B2 | 11/2014 | Endo et al. |
| 8,994,400 | B2 | 3/2015 | Kato et al. |
| 2001/0046027 | A1 | 11/2001 | Tai et al. |
| 2002/0036529 | A1 | 3/2002 | Furusawa et al. |
| 2002/0056838 | A1 | 5/2002 | Ogawa |
| 2002/0074568 | A1 | 6/2002 | Yoshida et al. |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0038582 | A1 | 2/2006 | Peeters |
| 2006/0043377 | A1 | 3/2006 | Hoffman et al. |
| 2006/0091793 | A1 | 5/2006 | Baude et al. |
| 2006/0095975 | A1 | 5/2006 | Yamada et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0119394 | A1 | 6/2006 | Dronavalli |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0024318 | A1 | 2/2007 | Mamidipaka |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0048744 | A1 | 2/2008 | Fukuoka |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0197414 | A1 | 8/2008 | Hoffman et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0102018 | A1 | 5/2011 | Shionoiri et al. |
| 2011/0121878 | A1* | 5/2011 | Kato .................. G11C 7/04 327/215 |

(56) References Cited

U.S. PATENT DOCUMENTS

| | | |
|---|---|---|
| 2011/0176357 A1 | 7/2011 | Koyama et al. |
| 2011/0187410 A1 | 8/2011 | Kato et al. |
| 2012/0140550 A1 | 6/2012 | Endo et al. |
| 2012/0250397 A1 | 10/2012 | Ohmaru |
| 2012/0250407 A1 | 10/2012 | Kurokawa |
| 2013/0069964 A1 | 3/2013 | Wuu et al. |
| 2013/0243149 A1 | 9/2013 | Yamazaki |
| 2014/0078816 A1 | 3/2014 | Koyama et al. |
| 2014/0126272 A1 | 5/2014 | Kurokawa |
| 2014/0159771 A1 | 6/2014 | Ikeda et al. |
| 2014/0204645 A1 | 7/2014 | Ohmaru et al. |
| 2014/0226394 A1 | 8/2014 | Endo et al. |
| 2014/0269013 A1* | 9/2014 | Tsutsui .................. G11C 11/401 365/149 |
| 2015/0022251 A1 | 1/2015 | Kato et al. |
| 2015/0070064 A1 | 3/2015 | Endo et al. |
| 2015/0070962 A1 | 3/2015 | Ohmaru et al. |
| 2015/0200657 A1 | 7/2015 | Kato et al. |
| 2015/0295570 A1 | 10/2015 | Ohmaru |
| 2015/0370313 A1 | 12/2015 | Tamura |
| 2016/0203852 A1 | 7/2016 | Tsutsui et al. |
| 2016/0226471 A1 | 8/2016 | Kato et al. |

FOREIGN PATENT DOCUMENTS

| | | |
|---|---|---|
| EP | 2199813 A | 6/2010 |
| EP | 2226847 A | 9/2010 |
| EP | 2887395 A | 6/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110392 A | 4/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-145134 A | 7/2010 |
| JP | 2011-129896 A | 6/2011 |
| JP | 2012-217158 A | 11/2012 |
| JP | 2012-257192 A | 12/2012 |
| JP | 2013-009297 A | 1/2013 |
| JP | 2013-021700 A | 1/2013 |
| JP | 2013-175708 A | 9/2013 |
| JP | 2014-123966 A | 7/2014 |
| WO | WO-2004/114391 | 12/2004 |
| WO | WO-2011/062075 | 5/2011 |

OTHER PUBLICATIONS

International Search Report (Application No. PCT/IB2015/057512) Dated Dec. 22, 2015.
Written Opinion (Application No. PCT/IB2015/057512) Dated Dec. 22, 2015.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. ( Applied Physics Letters ), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. ( Applied Physics Letters ) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 991-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. ( Journal of Applied Physics ) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. ( Japanese Journal of Applied Physics ) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. ( Applied Physics Letters ) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m < 4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. ( Applied Physics Letters ) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. ( Applied Physics Letters ) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. ( Applied Physics Letters ) , Jun. 17, 1996, vol. 68, No. 25, pp. 3650-3652.

(56) References Cited

OTHER PUBLICATIONS

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. ( Applied Physics Letters ) , Sep. 1, 2003, vol. 83, No. 9, pp. 175-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

103

LOGIC CIRCUIT, PROCESSING UNIT, ELECTRONIC COMPONENT, AND ELECTRONIC DEVICE

CROSS-REFERENCE TO RELATED APPLICATIONS

This application is a continuation of U.S. application Ser. No. 14/874,607, filed Oct. 5, 2015, now allowed, which claims the benefit of a foreign priority application filed in Japan as Serial No. 2014-209506 on Oct. 10, 2014, both of which are incorporated by reference.

TECHNICAL FIELD

One embodiment of the present invention disclosed in the specification, the drawings, and the claims (hereinafter referred to as "this specification and the like") relates to a semiconductor device (e.g., a sequential circuit, a retention circuit, a storage circuit, or a logic circuit), a driving method thereof, and a manufacturing method thereof. One embodiment of the present invention is not limited to the above technical field. For example, one embodiment of the present invention relates to a storage device, a processing unit, an imaging device, a display device, a light-emitting device, an electric storage device, a driving method thereof, or a manufacturing method thereof.

BACKGROUND ART

In order to reduce the power consumption of a semiconductor device, circuits that do not need to operate are stopped by power gating or clock gating. A flip-flop (FF) is a sequential circuit (storage circuit that holds a state) included a lot in a semiconductor device. Thus, a reduction in power consumption of the FF leads to a reduction in power consumption of a semiconductor device including the FF. When a general FF is powered off, a state (data) held therein is lost.

By taking advantage of extremely low off-state current of a transistor whose semiconductor region is formed using an oxide semiconductor (hereinafter, such a transistor may be referred to as an OS transistor), a retention circuit capable of retaining data even when powered off has been proposed. For example, Patent Documents 1 to 3 each disclose an FF that includes a retention circuit including an OS transistor and enables power gating. Non-Patent Document 1 discloses power gating of a processor by using a retention circuit that includes an OS transistor for each of an FF and an SRAM, for example.

REFERENCES

Patent Documents

Patent Document 1: Japanese Published Patent Application No. 2012-257192
Patent Document 2: Japanese Published Patent Application No. 2013-009297
Patent Document 3: Japanese Published Patent Application No. 2013-175708

Non-Patent Document

H. Tamura et al., "Embedded SRAM and Cortex-M0 Core with Backup Circuits Using a 60-nm Crystalline Oxide Semiconductor for Power Gating," IEEE COOL Chips XVII, April 2014.

DISCLOSURE OF INVENTION

An object of one embodiment of the present invention is to provide a novel semiconductor device or a novel method for driving the semiconductor device. Another object of one embodiment of the present invention is, for example, to perform power gating, to perform data retention without power supply, to reduce power consumption, to reduce size, or to facilitate design.

The description of a plurality of objects does not disturb the existence of each object. One embodiment of the present invention does not necessarily achieve all the objects described above. Other objects will be apparent from the description of this specification and the like, and such objects could be objects of one embodiment of the present invention.

One embodiment of the present invention is a logic circuit including a first circuit and a second circuit. The first circuit includes first to n-th input terminals (n is an integer of 2 or more) and a first output terminal. The second circuit includes an (n+1)th input terminal, a first node, a first capacitor, and first to third transistors. The first circuit has a function of selecting any one of the first to n-th input terminals and outputting data whose logic is the same as logic of the selected input terminal from the first output terminal. The capacitor is electrically connected to the first node. The first transistor has a function of controlling electrical connection between the (n+1)th input terminal and the first input terminal. The second transistor has a function of controlling electrical connection between the first output terminal and the first node. The third transistor has a function of controlling electrical connection between the first node and the first input terminal. A gate of the first transistor is electrically connected to a gate of the second transistor. The second transistor and the third transistor each include a semiconductor region formed using an oxide semiconductor layer.

In the above embodiment, the first capacitor and the first to third transistors may be stacked over a region where the first circuit is formed. In the above embodiment, the first transistor may include a semiconductor region formed using an oxide semiconductor layer. In that case, the oxide semiconductor layers of the first to third transistors preferably each include a c-axis aligned crystal.

In the logic circuit in the above embodiment, the first circuit may include a selection circuit and a first logic circuit. The first logic circuit may include an (n+2)th input terminal and the first output terminal. The first logic circuit may have a function of outputting data whose logic is the same as logic of the (n+2)th input terminal from the first output terminal. The selection circuit may include a second output terminal. The selection circuit may have a function of electrically connecting any one of the first to n-th input terminals to the second output terminal. The second output terminal may be electrically connected to the (n+2)th input terminal.

One embodiment of the present invention can provide a novel semiconductor device or a novel method for operating the semiconductor device. Alternatively, one embodiment of the present invention enables power gating, enables data retention without power supply, can reduce power consumption, can reduce size, or can facilitate design.

The description of the plurality of effects does not disturb the existence of other effects. In one embodiment of the present invention, there is no need to obtain all the effects described above. In one embodiment of the present invention, other objects, effects, and novel features will be apparent from the description of the specification and the drawings.

BEST MODE FOR CARRYING OUT THE INVENTION

Figure 1A:
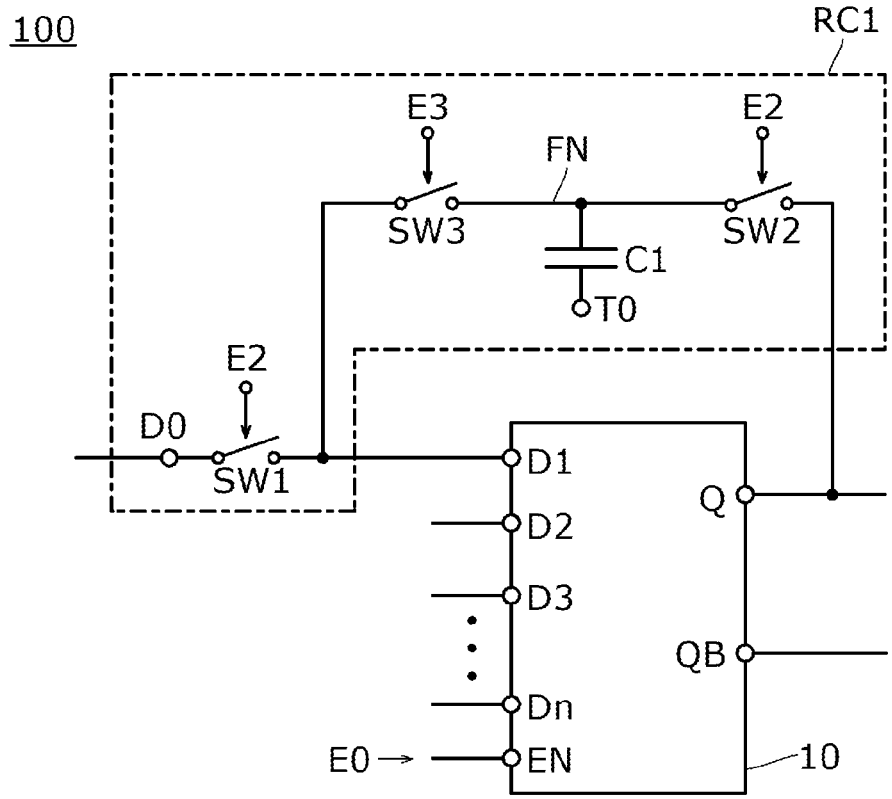
FIG. 1A is a block diagram illustrating a structure example of a logic circuit.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are all semiconductor devices. Moreover, a storage device, a display device, a light-emitting device, a lighting device, an electronic device, and the like themselves might be semiconductor devices, or might each include a semiconductor device.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer).

A transistor is an element having three terminals: a gate, a source, and a drain. The gate functions as a control node for controlling conduction of the transistor. Depending on the type of the transistor or levels of potentials applied to the terminals, one of two input/output nodes functions as a source and the other functions as a drain. Therefore, the terms "source" and "drain" can be interchanged with each other in this specification and the like. In this specification and the like, two terminals except a gate are referred to as a first terminal and a second terminal in some cases.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

Note that voltage refers to a potential difference between a given potential and a reference potential (e.g., a ground potential (GND) or a source potential) in many cases. Voltage can be referred to as a potential. Note that a potential has a relative value. Accordingly, a ground potential does not necessarily mean 0 V.

In this specification and the like, the terms "film" and "layer" can be interchanged with each other depending on circumstances or conditions. For example, the term "conductive layer" can be changed into the term "conductive film" in some cases. The term "insulating film" can be changed into the term "insulating layer" in some cases, for example.

In this specification and the like, ordinal numbers such as "first," "second," and "third" are used to avoid confusion among components, and thus do not limit the number of components or do not limit the order.

In this specification and the like, a clock signal CLK is abbreviated to "a signal CLK," "CLK," or the like in some cases. The same applies to other components (e.g., signals, voltages, potentials, circuits, elements, electrodes, and wirings).

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over" and "under," are used for convenience for describing the positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relationship of circuit blocks in a block diagram is specified for description. Even in the case where a block diagram shows that different functions are achieved by different circuit blocks, one circuit block might be actually configured to achieve different functions. The functions of circuit blocks are specified for description. Even in the case where one circuit block is illustrated, blocks might be provided in an actual circuit block so that processing performed by one circuit block is performed by a plurality of circuit blocks.

Embodiments of the present invention will be described below. Note that any of the embodiments described in this specification can be combined as appropriate. In addition, in the case where a plurality of structure examples (including operation examples and manufacturing method examples) are given in one embodiment, any of the structure examples can be combined as appropriate. The present invention can be implemented in various different modes, and it will be readily appreciated by those skilled in the art that modes and details of the present invention can be modified in various ways without departing from the spirit and scope of the present invention. The present invention therefore should not be construed as being limited to the following description of the embodiments.

Embodiment 1

Structure Example of Logic Circuit

FIG. 1A illustrates a structure example of a logic circuit. A logic circuit 100 in FIG. 1A is a semiconductor device capable of retaining data (state). Depending on a circuit structure or the like, the logic circuit 100 can also be referred to as a sequential circuit. The logic circuit 100 is a semiconductor device capable of clock gating and power gating. The logic circuit 100 includes a circuit 10 and a circuit RC1. The circuit RC1 is a retention circuit having a function of retaining data. The circuit RC1 has a function of reading and retaining the state (data) of the circuit 10. In addition, the circuit RC1 has a function of outputting retained data to the circuit 10.

<Circuit 10>

The circuit 10 includes terminals D1 to Dn (n is an integer of 2 or more), a terminal Q, a terminal QB, and a terminal EN. The terminals D1 to Dn are data input terminals. The terminals Q and QB are data output terminals. A control signal E0 is input to the terminal EN. The circuit 10 is a logic circuit. The circuit 10 has a function of selecting any one of the terminals D1 to Dn in accordance with the logic of the terminal EN and a calculation function of outputting data whose logic is the same as the logic of data, which is input to the selected terminal, from the terminal Q. The terminal QB outputs data whose logic is inverted from the logic of the terminal Q. In the example of FIG. 1A, the circuit 10 does not necessarily include the terminal QB.

Figure 1B:
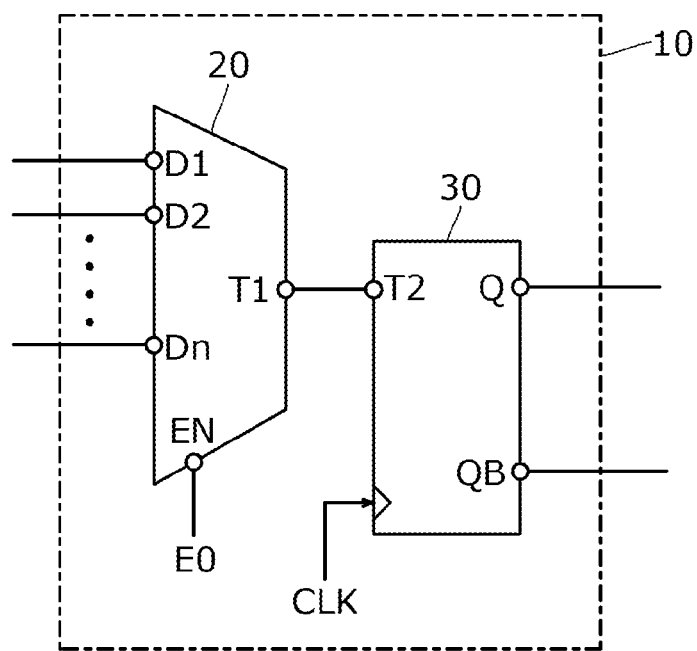
FIG. 1B is a block diagram illustrating a structure example of a circuit 10 in FIG. 1A.

FIG. 1B illustrates a structure example of the circuit 10. The circuit 10 in FIG. 1B includes a selection circuit 20 and a circuit 30. A terminal T1 of the selection circuit 20 is electrically connected to a terminal T2 of the circuit 30. The terminal T1 is an output terminal of the selection circuit 20, and the terminal T2 is an input terminal of the circuit 30.

The signal E0 is a signal for controlling the selection circuit 20. The selection circuit 20 has a function of selecting any one of the terminals D1 to Dn in response to the signal E0 and electrically connecting the selected terminal to the terminal T1.

The circuit 30 is a logic circuit. The circuit 30 has a calculation function of outputting data whose logic is the same as the logic of data, which is input to the terminal T2, from the terminal Q. For example, the circuit 30 can be a sequential circuit whose internal state is updated by a control signal such as a clock signal CLK. The circuit 30 can be, for example, a latch, a flip-flop, a shift register, a counter circuit, or a frequency division circuit.

<Circuit RC1>

The circuit RC1 includes a node FN, a terminal D0, a terminal T0, a switch SW1, a switch SW2, a switch SW3, and a capacitor C1. The terminals D0 and T0 are input terminals.

The node FN can be electrically floating and functions as a data (state) retention portion of the circuit RC1. One terminal of the capacitor C1 is electrically connected to the node FN. The other terminal of the capacitor C1 is electrically connected to the terminal T0. The capacitor C1 can function as a storage capacitor that holds the voltage of the node FN. A signal or fixed voltage can be input to the terminal T0. For example, low power supply voltage of the circuit 10 may be input to the terminal T0.

The switch SW1 controls electrical connection between the terminal D0 and the terminal D1, and the switch SW2 controls electrical connection between the terminal Q and the node FN. The on/off states of the switches SW1 and SW2 are controlled by a signal E2. The switch SW3 controls electrical connection between the node FN and the terminal D1. The on/off state of the switch SW3 is controlled by a signal E3.

(Normal Operation)

In order to process data input to the circuit 10, the switch SW3 is turned off. The switch SW1 is turned on as necessary. When data processed by the circuit 10 does not contain data of the terminal D1, the switch SW1 may be turned off. When data processed by the circuit 10 contains data of the terminal D1, the switch SW1 may be turned on. The switch SW2 may be either on or off. In the example of FIG. 1A, the switch SW2 is also turned on by the signal E2 in conjunction with the switch SW1. Different control signals may be used for the switches SW1 and SW2 to turn off the switch SW2. When a common control signal is used for the switches SW1 and SW2, the number of wirings and the number of elements are reduced, which leads to a reduction in power consumption.

(Backup Operation)

In order to back up the state of the circuit 10, input of signals such as CLK to the circuit 10 is stopped as necessary so as not to change the logic (state) of the terminal Q. Next, the switch SW2 is turned on and the switch SW3 is turned off. Since the node FN is electrically connected to the terminal Q, the logic of the node FN is the same as that of the terminal Q. When the logic of the terminal Q is "1," the logic of the node FN is also "1." When the logic of the terminal Q is "0," the logic of the node FN is also "0." The switches SW2 and SW3 are turned off to make the node FN electrically floating, so that backup operation is completed and the circuit RC1 retains data.

When the backup operation is completed, supply of power to the circuit 10 can be stopped. In other words, when the circuit RC1 is provided, clock gating and power gating of the circuit 10 can be performed.

(Restore Operation)

In order to restore the state of the circuit 10, power is supplied to the circuit 10 and data of the terminal D1 is made to be output from the terminal Q to the circuit 10 by the signal E0. Since the terminal D1 is electrically connected to the node FN, the logical level of the terminal D1 is the same as that of the node FN. Thus, the circuit 10 can output data whose logic is the same as the logic of data retained in the node FN from the terminal Q. In other words, the state of the logic circuit 100 is restored.

The switch SW3 is turned off. When supply of the signal CLK is restarted as necessary, the logic circuit 100 can perform normal operation. Note that in the case where the logic of the terminal Q needs to be the same as the logic of the node FN in a data retention period before the supply of the signal CLK is restarted, a control signal such as the signal CLK may be supplied before the switch SW3 is turned off so that the circuit 10 performs normal operation, and the data of the terminal D1 may be written to the terminal Q.

The circuit RC1 may have retention characteristics such that data can be retained while the circuit 10 is power gated. To retain data in the circuit RC1 for a long time, a potential change (in particular, a potential drop) of the electrically floating node FN is preferably reduced as much as possible. A means for achieving this is to use a transistor with extremely low drain current in an off state (off-state current) as each of the switches SW2 and SW3.

To reduce off-state current of a transistor, a semiconductor region contains a semiconductor with a wide energy gap, for example. The energy gap of the semiconductor is preferably greater than or equal to 2.5 eV, greater than or equal to 2.7 eV, or greater than or equal to 3 eV. An example of such a semiconductor is an oxide semiconductor. The switches SW2 and SW3 are each a transistor (OS transistor) whose semiconductor region contains an oxide semiconductor, for example. The leakage current of an OS transistor normalized by channel width can be, for example, lower than or equal to $10 \times 10^{-21}$ A/μm (10 zA/μ) with a source-drain voltage of 10 V at room temperature (approximately 25° C.). It is preferable that the leakage current of the OS transistor used as each of the switches SW2 and SW3 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$ A at 85° C.

Avalanche breakdown or the like is less likely to occur in some cases in an OS transistor than in a general transistor including silicon or the like because an oxide semiconductor has a wide energy gap and thus electrons are less likely to be excited, and the effective mass of a hole is large. Since hot-carrier degradation or the like due to the avalanche breakdown is inhibited, the OS transistor has high drain withstand voltage and can be driven at high drain voltage. Accordingly, the use of the OS transistor in the circuit RC1 can leave a wide margin for driving conditions such as the potential level of a signal and input timing. The circuit RC1 can be driven such that the voltage of the node FN is high when data is retained, for example.

An oxide semiconductor included in the OS transistor is preferably an oxide containing at least one or more elements selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. In addition, the oxide may contain an element or a compound other than the constituent elements of the oxide, for example, an oxide semiconductor containing $SiO_2$.

Furthermore, the OS transistor can have excellent off-state current characteristics and subthreshold characteristics even with a gate insulating layer with an equivalent oxide thickness of approximately 11 nm and a short channel length of 50 nm. Since a gate insulating layer in the OS transistor can be thicker than that in a Si transistor generally used in a logic circuit, leakage current through the gate insulating layer can be reduced and variation in electrical characteristics due to variation in the thickness of the gate insulating layer can be suppressed. The details of the OS transistor will be described in Embodiment 4.

There is no particular limitation on the switch SW1 and a transistor included in the circuit 10, and a general transistor included in a standard cell can be used. For example, a transistor whose semiconductor region contains a Group 14 element (Si, Ge, or C) can be used. A typical example of the transistor in the circuit 10 is a transistor (Si transistor) whose semiconductor region contains silicon. For the purpose of improving the mobility of the Si transistor or for other purposes, a distortion transistor where Ge is added to a semiconductor region containing Si may be used.

The switch SW1 may be an OS transistor like the switches SW2 and SW3, or a CMOS circuit such as an analog switch. When an OS transistor is used as the switch SW1, the area overhead of the logic circuit 100 due to addition of the circuit RC1 can be zero as described below. When an analog switch (a switch in which an n-channel transistor is connected in parallel to a p-channel transistor) is used as the switch SW1, an n-channel OS transistor is stacked over a p-channel Si transistor. In that case, the increase in the area of the logic circuit 100 can be reduced as compared to the case where the analog switch is formed using only Si transistors. Note that the analog switch is also referred to as a transfer gate.

There is no need to change the circuit structure of the circuit 10 in the logic circuit 100 due to the circuit RC1. For example, in the case of a structure example in FIG. 1B, a general circuit such as a selector or a multiplexer can be used as the selection circuit 20. A general sequential circuit such as a latch or a flip-flop can be used as the circuit 30. Since the circuit RC1 can be stacked over the circuit 10, the circuit RC1 can be provided without changing the design and layout of the circuit 10.

As described above, with the retention circuit in this embodiment, a logic circuit can have a backup function without changing the circuit structure and layout of the logic circuit. In addition, with the retention circuit, the logic circuit can have a backup function without a substantial decrease in performance in normal operation. Furthermore, since the retention circuit can be stacked over a region where the logic circuit is formed, area overhead due to addition of the retention circuit can be zero.

<Modification of Retention Circuit>

Figure 2A:
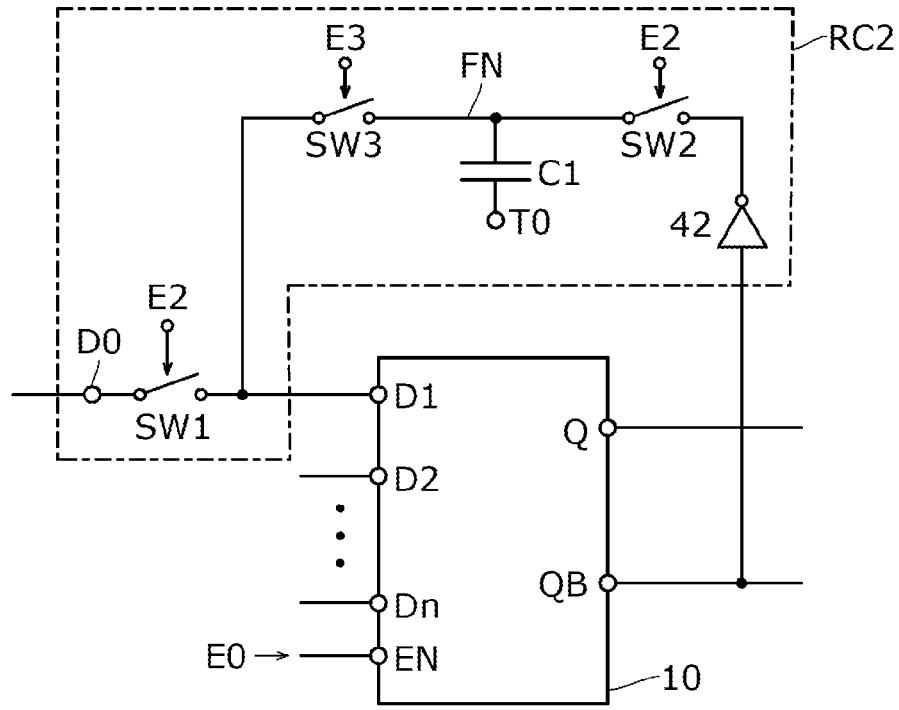
FIGS. 2A and 2B are block diagrams each illustrating a structure example of a logic circuit.

A logic circuit 101 in FIG. 2A includes a circuit RC2 instead of the circuit RC1. The circuit RC2 is obtained by addition of an inverter 42 to the circuit RC1. An input terminal of the inverter 42 is electrically connected to the terminal QB, and an output terminal of the inverter 42 is electrically connected to the switch SW2. Data obtained by logically inverting the terminal QB is retained in the circuit RC2. Thus, the circuit RC2 can retain data whose logic is the same as the logic of the terminal Q and can write the retained data to the terminal D1. Power is preferably supplied to the inverter 42 only in backup operation.

Figure 2B:
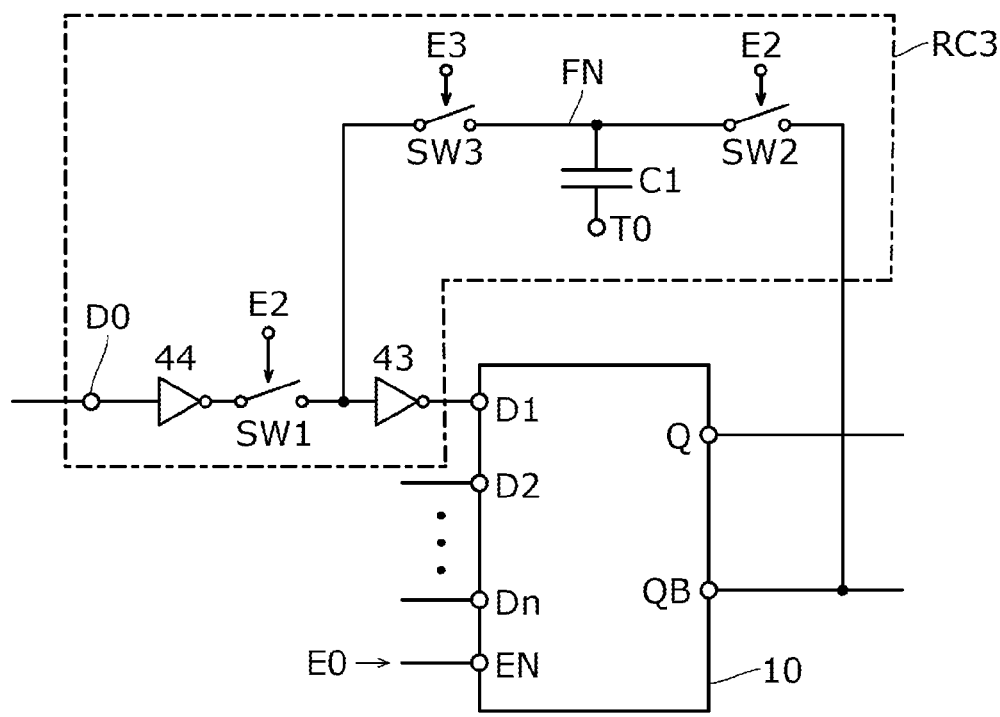

A logic circuit 102 in FIG. 2B includes a circuit RC3 instead of the circuit RC1. The circuit RC3 is obtained by addition of inverters 43 and 44 to the circuit RC1. An input terminal of the inverter 43 is electrically connected to the switches SW1 and SW3, and an output terminal of the inverter 43 is electrically connected to the terminal D1. An input terminal of the inverter 44 is electrically connected to the terminal D0, and an output terminal of the inverter 44 is electrically connected to the switch SW1. The switch SW2 controls electrical connection between the terminal QB and the node FN. Through backup operation, the circuit RC3 retains data whose logic is the same as the logic of the terminal QB. Data written to the terminal D1 by restore operation is obtained by inversion of the logic of the node FN by the inverter 43. In other words, data whose logic is the same as the logic of the terminal Q can be written to the terminal D1.

The circuits 10 in FIGS. 2A and 2B do not necessarily include the terminal Q.

<Modification of Logic Circuit>

Figure 3:
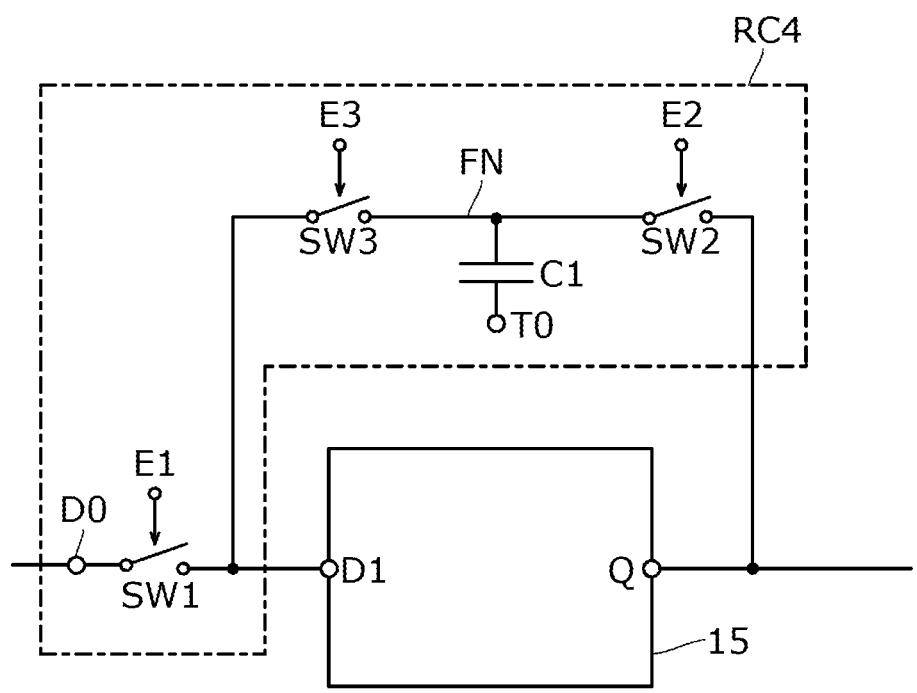
FIG. 3 is a block diagram illustrating a structure example of a logic circuit.

A logic circuit 103 in FIG. 3 is a modification of the logic circuit 101. The circuit 10 in FIG. 3 is a 1-input circuit 15. The circuit 15 is a logic circuit. The circuit 15 has a calculation function of outputting data whose logic is the same as the logic of the terminal D1. A control signal such as CLK may be input to the circuit 15 as necessary. In addition, the circuit 15 may include the terminal QB. The circuit 15 is, for example, a buffer circuit.

The circuit RC4 is a modification of the circuit RC1. The switches SW1 to SW3 are controlled by different signals E1 to E3. Consequently, only the switch SW1 can be turned on in normal operation of the logic circuit 103, and SW1 can be turned off in backup operation.

Embodiment 2

Structure Example of Scan Flip-Flop

Examples of a specific circuit structure and a driving method of the logic circuit 100 are described. Here, the logic circuit 100 is a scan flip-flop. A scan flip-flop (SFF) 110 in FIG. 4 includes a scan flip-flop (SFF) 11 and a circuit RC11. The SFF 11 includes a selection circuit (SEL) 21 and a flip-flop (FF) 31. The circuit RC11 has a function of retaining data. The SFF 110 can be referred to as a scan FF with a backup function. The SFF 110 can be provided in a power domain where power gating is performed.

<Structure Example of SFF 11>

Figure 5:
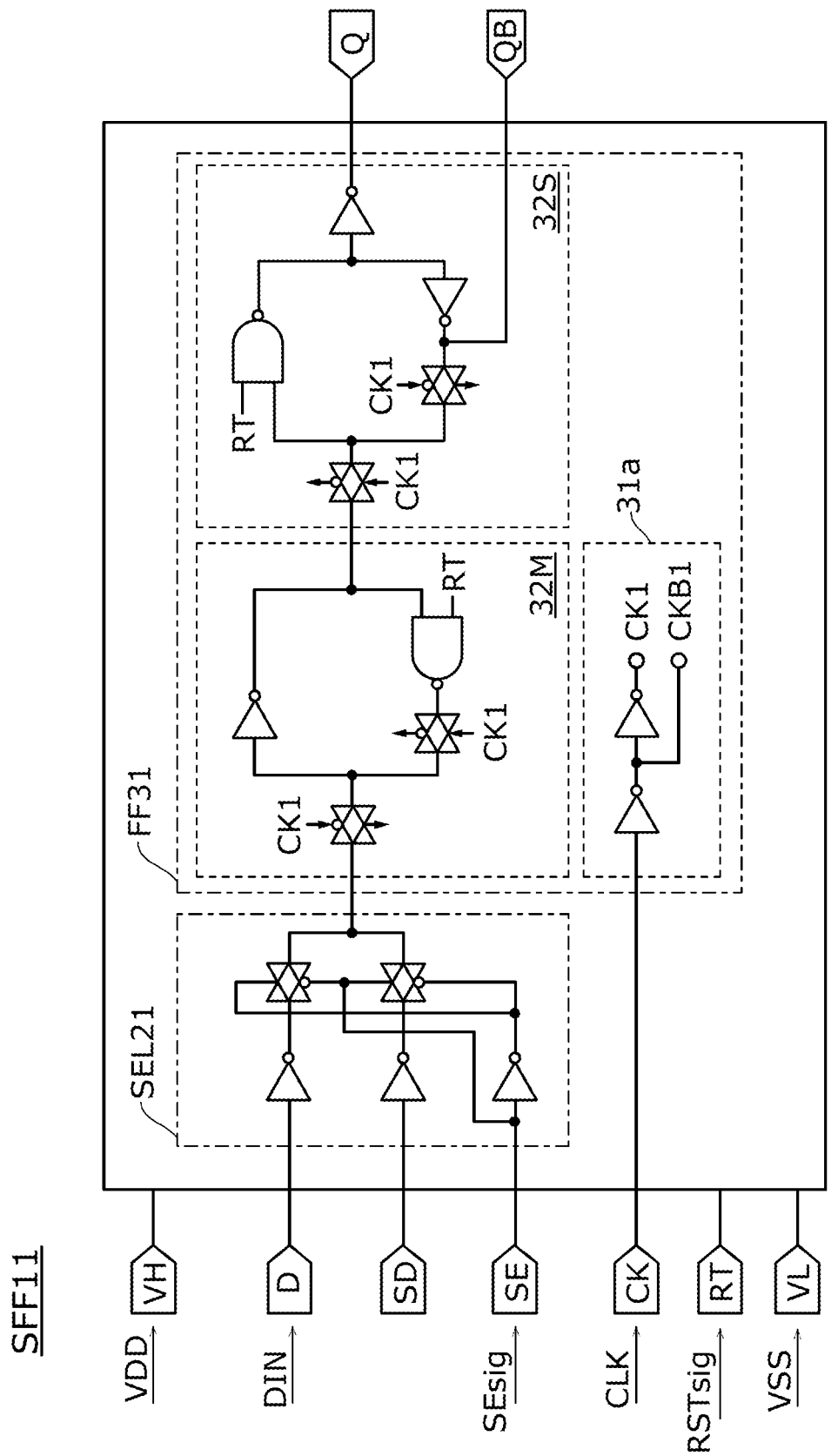
FIG. 5 is a circuit diagram illustrating a structure example of an SFF.

FIG. 5 is a circuit structure example of the SFF 11. The SFF 11 in FIG. 5 includes the SEL 21, the FF 31, and terminals VH, VL, D, Q, QB, SD, SE, CK, and RT.

The terminal VH is a power supply terminal for high power supply voltage VDD, and the terminal VL is a power supply terminal for low power supply voltage VSS. VDD and VSS are supplied to inverters of the SEL 21, and inverters and NAND circuits (hereinafter referred to as NAND) of the FF 31. VDD is input to the terminal VH through a power switch.

The terminals D and SD are data input terminals. The terminal D is electrically connected to an output terminal of a logic circuit (e.g., a combinational circuit), and data DIN is input to the terminal D. Restore data or scan test data SCNIN is input to the terminal SD through the circuit RC11 (see FIG. 4). The terminal Q is a data output terminal. The terminal Q is electrically connected to a terminal SD_IN of another SFF 110 and a data input terminal of the logic circuit. The terminal QB outputs data whose logic is inverted from the logic of the terminal Q. The terminal QB is electrically connected to a data input terminal of another logic circuit. The terminal QB is provided as necessary.

The terminals SE, CK, and RT are input terminals for control signals. A scan enable signal SEsig is input to the terminal SE. SE is electrically connected to the SEL 21. The clock signal CLK is input to the terminal CK. The terminal CK is electrically connected to a circuit 31a. A reset signal RSTsig is input to the terminal RT. The terminal RT is electrically connected to the NAND of the FF 31.

(SEL 21)

The SEL 21 has a function of selecting one of the terminals D and SD in accordance with the voltage (logic) of the terminal SE and electrically connecting the selected terminal to an input terminal of the FF 31. When scan test is performed, a signal SE is set to high-level voltage ("H") and the terminal SD is electrically connected to the input terminal of the FF 31. When the SFF 11 normally operates as a flip-flop, the terminal SE is set to low-level voltage ("L") and the terminal D is electrically connected to the input terminal of the FF 31.

(FF 31)

The FF 31 includes two latches 32M and 33S and the circuit 31a. The latch 32M is a master latch and the latch 32S is a slave latch. The latch 32M is electrically connected in series with the latch 32S. The circuit 31a is a circuit for inputting clock signals, which includes terminals CK1 and CKB1. The terminal CK1 outputs a non-inverted clock signal of the signal CLK. The terminal CKB1 outputs an inverted clock signal of the signal CLK. The terminals CK1 and CKB1 are each electrically connected to an analog switch of the FF 31.

<Structure Example 1 of Retention Circuit>

Figure 4:
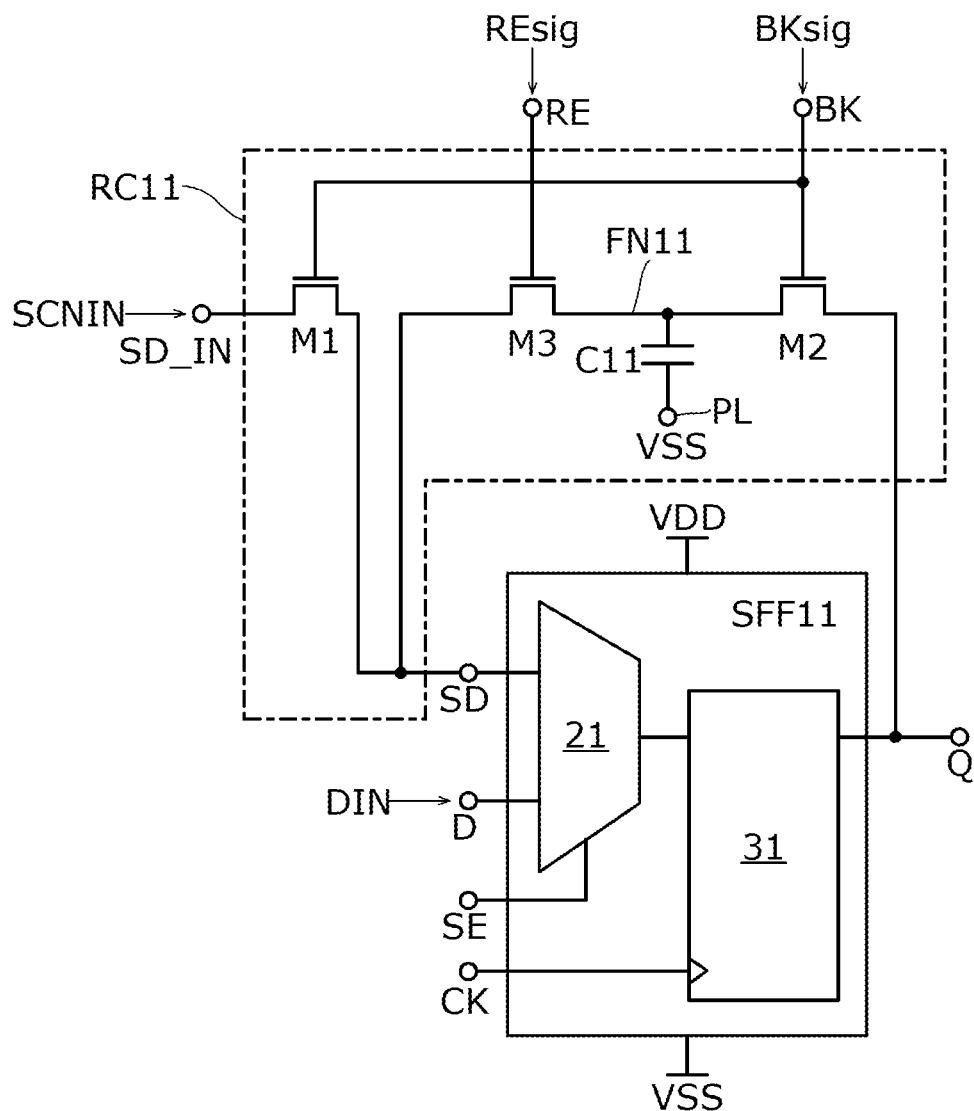
FIG. 4 is a circuit diagram illustrating a structure example of a scan FF (SFF)

The circuit RC11 in FIG. 4 includes terminals SD_IN, RE, BK, and PL, a node FN11, transistors M1 to M3, and a capacitor C11. The switches SW1 to SW3 in the circuit RC1 are replaced with the transistors M1 to M3 in the circuit RC11. Note that in the following description, the terminal VH is referred to as VH in some cases. The same applies to other terminals. In addition, the node FN11 is referred to as FN11 in some cases.

SD_IN is an input terminal for the scan test data SCNIN. BK and RE are input terminals for control signals. A signal for controlling backup operation (a backup signal BKsig) is input to BK. BK is electrically connected to gates of the transistors M1 and M2. A signal for controlling restore operation (a restore signal REsig) is input to RE. RE is electrically connected to a gate of the transistor M3.

One of two terminals of the capacitor C11 is electrically connected to FN11. The other of the two terminals of the capacitor C11 is electrically connected to PL. VSS is input to PL. The transistors M1 to M3 are n-channel transistors, here, OS transistors. The transistor M1 is a pass transistor for electrically connecting SD_IN to SD. The transistor M2 is a pass transistor for electrically connecting Q to FN11. The transistor M3 is a pass transistor for electrically connecting FN11 to SD.

Since the transistors M2 and M3 are OS transistors, a decrease in the voltage of FN11 can be reduced even when FN11 retains data "1." Thus, the circuit RC11 can function as a backup nonvolatile storage circuit of the SFF 11. In addition, a semiconductor device including the SFF 110 can be power gated, and the power consumption of the semiconductor device can be reduced.

Note that in a data retention period of the circuit RC11, voltage that turns off the transistors M2 and M3 completely might be continuously supplied to gates. Alternatively, in the case where the transistors M2 and M3 include back gates, voltage that makes the transistors M2 and M3 normally-off might be continuously supplied to the back gates. In such a case, the voltage is supplied to the circuit RC11 in the retention period. However, the circuit RC11 consumes little power because almost no current flows. Because the circuit RC11 consumes little power even when predetermined voltage is supplied to the circuit RC11 in the retention period, the circuit RC11 can be regarded as being nonvolatile.

<Operation Example of Scan Flip-Flop>

Figure 6:
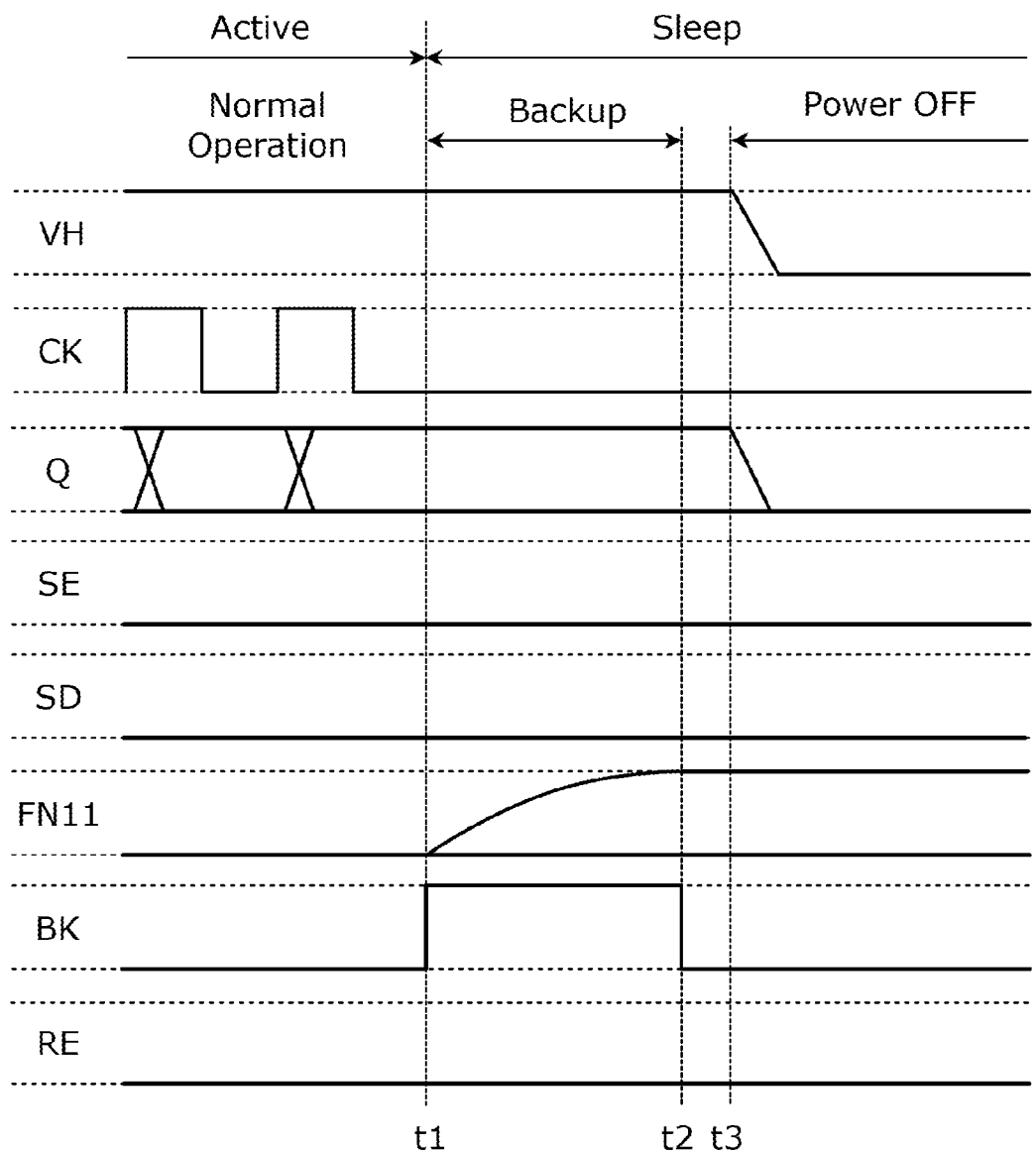
FIG. 6 is a timing chart illustrating an operation example of an SFF.
Figure 7:
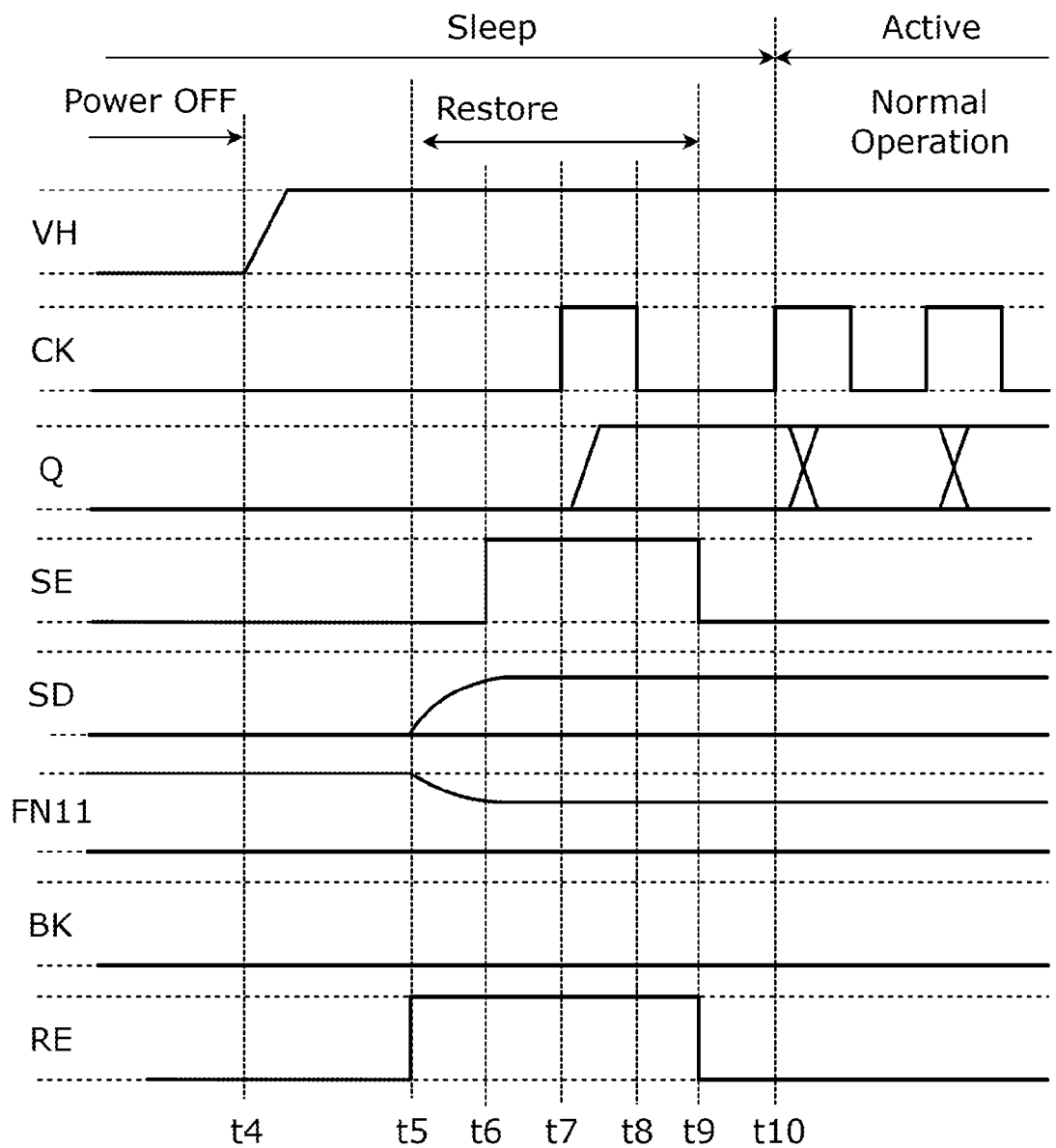
FIG. 7 is a timing chart illustrating an operation example of an SFF.

FIG. 6 and FIG. 7 are timing charts each illustrating an operation example of the SFF 110. FIG. 6 illustrates an operation example of the SFF 110 when the semiconductor device including the SFF 110 is transferred from an active mode to a sleep mode. FIG. 7 illustrates an operation example of the SFF 110 when the semiconductor device is transferred from the sleep mode to the active mode. FIG. 6 and FIG. 7 illustrate changes in the voltage (logic) of the terminals VH, CK, Q, SE, SD, BK, and RE, and the node FN11. In FIG. 6 and FIG. 7, the maximum voltage is VDD and the minimum voltage is VSS. Furthermore, t1 to t10 each indicate time.

<Active Mode (Normal Operation Mode)>

In the active mode, the SFF 110 performs normal operation. The SFF 110 functions as a flip-flop that temporarily retains output data from the logic circuit. Here, data output from the logic circuit is input to the terminal D. In normal operation, RE and BK are "L," and the transistors M1 to M3 are off. SE is "L" and the terminal D is connected to the input terminal of the FF 31 by the SEL 21. RT is "H." The signal CLK is input to CK. In conjunction with the change of CK into "H," the voltage (logic) of Q is changed.

<Scan Mode>

In the scan mode, a plurality of SFFs 110 are electrically connected in series to form a scan chain. In the circuit RC11, the transistors M1 and M2 are turned on and the transistor M3 is turned off. Since SE is "H," SD is electrically connected to the input terminal of the FF 31 by the SEL 21. In other words, in the scan mode, data output from Q in the SFF 11 is input to SD of the SFF 11 in the next stage.

(Scan Test)

In order to perform scan test, the mode is set to the scan mode, and the scan test data SCNIN is input to SD_IN of the SFF 110 in a first stage of the scan chain. Shift operation of the scan chain is performed by input of CLK, and the scan test data SCNIN is written to the SFF 110 in the scan chain. Next, the SFF 110 performs normal operation to retain data output from the logic circuit in the SFF 110. The mode is set to the scan mode again to perform the shift operation of the scan chain. Whether the logic circuit and the SFF 110 fail to operate properly can be determined from data output from Q of the SFF 110 in the last stage.

(Backup Sequence)

Backup sequence is performed by transfer from the active mode to the sleep mode. In the backup sequence, clock gating (clock stop), data backup, and power gating (power-off) are performed. The mode is set to the sleep mode by stopping supply of clocks.

In the example of FIG. 6, clock gating of the SFF 11 is started at t1, and backup operation is started in the circuit RC11. Specifically, CK is set to "L" and BK is set to "H" at t1. A period during which BK is "H" is a backup operation period. When BK is set to "H," the transistor M2 electrically connects FN11 to Q. Thus, FN11 remains "L" when Q is "0," and the voltage of FN11 is raised to "H" when Q is "1." In other words, in the period during which BK is "H," the logic of FN11 can be the same as the logic of Q. The period during which BK is "H" may be determined so that the voltage of FN11 can be raised to a "1" logical level. At t2, BK is set to "L" to turn off the transistors M1 and M2, so that FN11 becomes electrically floating and the circuit RC11 retains data.

At t3, power is turned off to set RT to "L." The voltage of VH is gradually dropped from VDD to VSS. Power may be turned off at t2. Furthermore, power is turned off as necessary. Depending on the power domain of the semiconductor device including the SFF 110, the sleep mode time, or the like, power required to back up from the sleep mode to the active mode might be higher than power that can be reduced by power-off. In that case, the effect of power gating cannot be obtained; thus, in the sleep mode, it is preferable that power be not turned off and only supply of clocks be stopped.

(Restore Sequence)

In a restore sequence where the mode is transferred from the sleep mode to the active mode, power is turned on, data is restored, and clocks are supplied. The mode is transferred to the active mode by starting supply of clocks.

Power is turned on at t4. The voltage of VH is gradually increased from VSS to VDD. Restore operation is started after VH is set to VDD. SE and RE are set to "H" at t5. In addition, RT is set to "H." Restore operation is performed while RE is "H." The transistor M3 is turned on and FN11 is connected to SD. When FN11 is "L," SD remains "L." When FN11 is "H," the voltage of SD is increased to "H." SE is set to "H" at t6. SD is electrically connected to the input terminal of the FF 31 by SE and the SEL 21. In other words, when RE is set to "H," data retained in FN11 is written to SD.

Note that at t5, SE as well as RE can be set to "H." As illustrated in FIG. 7, in the case where FN11 is "H," SE is preferably set to "H" after the voltage of SD is raised to the "1" logical level. This driving prevents flow-through current from flowing through the SFF 11.

In the case where FN11 is connected to SD while FN11 is "H" in order to write data of FN11 to SD by capacitance distribution, the voltage of FN11 is decreased by parasitic capacitance of SD. Thus, capacitance of C11 needs to be much higher than the parasitic capacitance of SD. The capacitance of C11 is determined in consideration of characteristics and the like of the logic circuit to which data of SD is input. For example, in the case where the threshold voltage of this logic circuit is VDD/2, the capacitance of C11 needs to be higher than or equal to the parasitic capacitance of SD.

After the logic of SD becomes the same as the logic of FN11, CK is "H" for a certain period (from t7 to t8). In the example of FIG. 7, CLK for one clock is input to CK. When CK is set to "H" at t7, data of the latch 32M is written to the latch 32S. Q is set to "0" when SD is "0" at t7, and Q is set to "1" when SD is "1." In other words, data of FN11 is written to Q, and the SFF 110 returns to a state immediately before the supply of CLK is stopped (i.e., the mode is set to the sleep mode). The restore operation is terminated at t9 by setting SE and RE to "L." D is electrically connected to the input terminal of the FF 31 by the SEL 21. In the circuit RC11, the transistor M3 is turned off and the node FN11 becomes floating.

After SE and RE are set to "L," the input of CLK is restarted at t10 after a lapse of a certain period (e.g., one clock period) to set the SFF 110 in the active mode. The SFF 110 performs normal operation.

As described above, the SFF 110 can back up and restore data at high speed, and for example, can complete backup operation and restore operation within several clocks (2 to 5 clocks).

In write operation of the circuit RC11, FN11 is charged or discharged by switching operation of the transistors M1 to M3. In read operation of the circuit RC11, SD is charged or discharged by switching operation of the transistors M1 to M3. Energy required for these operations is as low as energy required for a DRAM cell. There is no need to supply power to the circuit RC1 for data retention; thus, standby power of the SFF 110 can be reduced. Similarly, there is no need to supply power to the circuit RC11 in normal operation; thus, the circuit RC11 does not lead to a substantial increase in dynamic power of the SFF 110. The circuit RC11 adds parasitic capacitance of the transistor M1 to the terminal Q. However, this parasitic capacitance is lower than parasitic capacitance of a logic circuit connected to the terminal Q. Consequently, normal operation of the SFF 110 is not influenced, and the circuit RC11 does not lead to a substantial decrease in the performance of the SFF 110 in the active mode.

Other circuit structure examples of the retention circuit are described below giving scan FFs as examples.

<Structure Example 2 of Retention Circuit>

Figure 8:
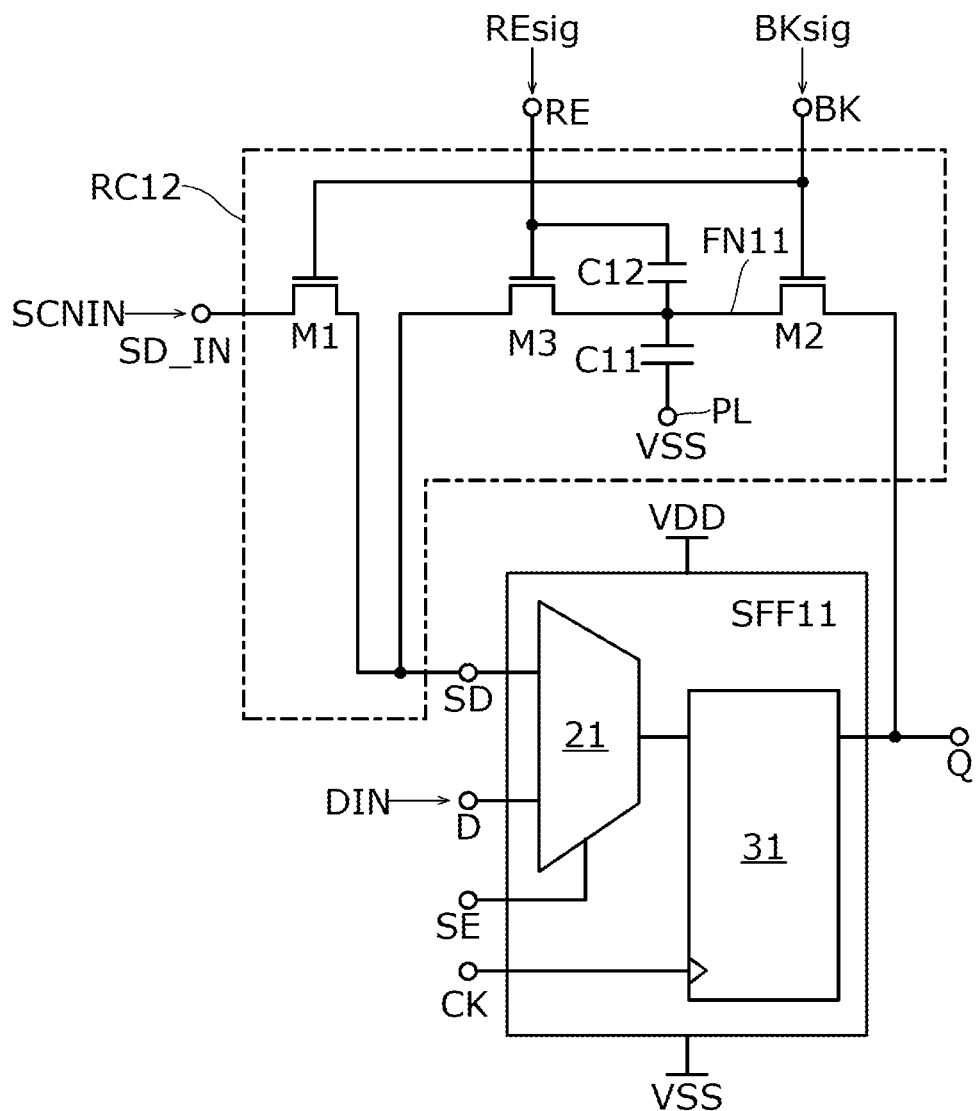
FIG. 8 is a circuit diagram illustrating a structure example of an SFF.

An SFF 112 in FIG. 8 includes a circuit RC12 and the SFF 11. The circuit RC12 is a modification of the circuit RC11 (FIG. 4), which includes a capacitor C12 for capacitive coupling between the node FN11 and the terminal RE. With such a circuit structure, when the voltage of RE is set to VDD ("H") in restore operation, the voltage of the node FN11 can be increased. Thus, the circuit RC12 can retain the "H" voltage longer than the circuit RC11. However, in that case, even when the node FN11 holds the "L" voltage, the voltage of the node FN11 is increased. Thus, in that case, when the "L" voltage of the node FN11 is written to SD, the capacitance of the capacitor C12 is set so that the voltage of SD has a "0" logical level. Consequently, the capacitance of the capacitor C12 is lower than the capacitance of C11.

<Structure Examples 3 and 4 of Retention Circuit>

Figure 9:
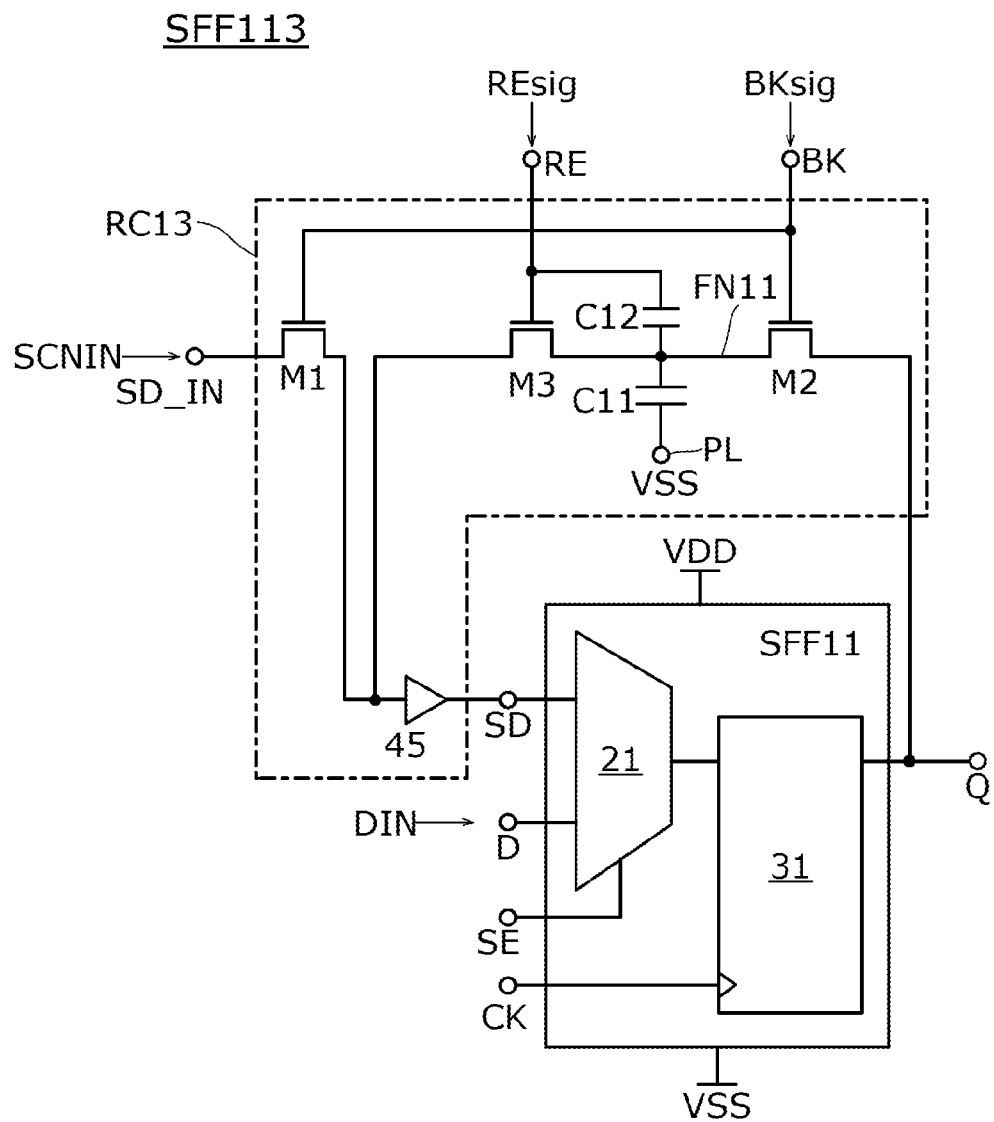
FIG. 9 is a circuit diagram illustrating a structure example of an SFF.

An SFF 113 in FIG. 9 includes a circuit RC13 and the SFF 11. An SFF 114 in FIG. 10 includes a circuit RC14 and the SFF 11.

In the circuit RC12 in FIG. 8, when "H" voltage of the node FN11 is written to the node SD, the voltage of SD might exceed the "1" logical level depending on the capacitance ratio of the capacitor C12 to the capacitor C11. In such a case, the circuit RC13 or the circuit RC14 may be used as a retention circuit. The circuit RC13 is a circuit obtained by addition of a buffer 45 (hereinafter referred to as a BUF 45) to the circuit RC12. An input terminal of the BUF 45 is electrically connected to a drain (source) of the transistor M3. An output terminal of the BUF 45 is electrically connected to SD. A transistor in the BUF 45 preferably withstands gate voltage that exceeds VDD.

Figure 10:
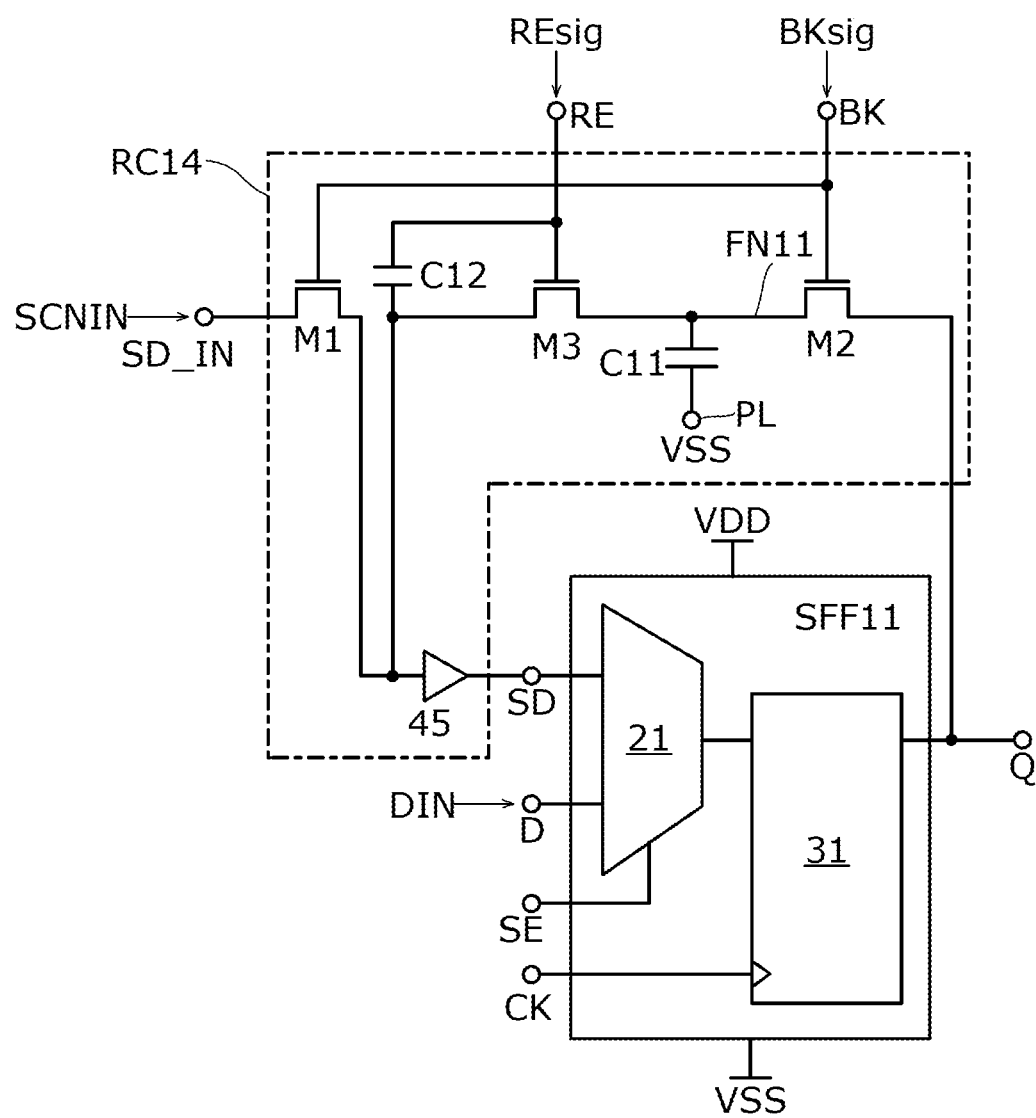
FIG. 10 is a circuit diagram illustrating a structure example of an SFF.

The circuit RC14 in FIG. 10 is a modification of the circuit RC13. As illustrated in FIG. 10, connection of the capacitor C12 is changed. One terminal of the capacitor C12 is electrically connected to the drain (source) of the transistor M3. The other terminal of the capacitor C12 is electrically connected to the input terminal of the BUF 45. The BUF 45 is provided in the circuit RC14 as necessary.

<Structure Examples 5 and 6 of Retention Circuit>

Figure 11:
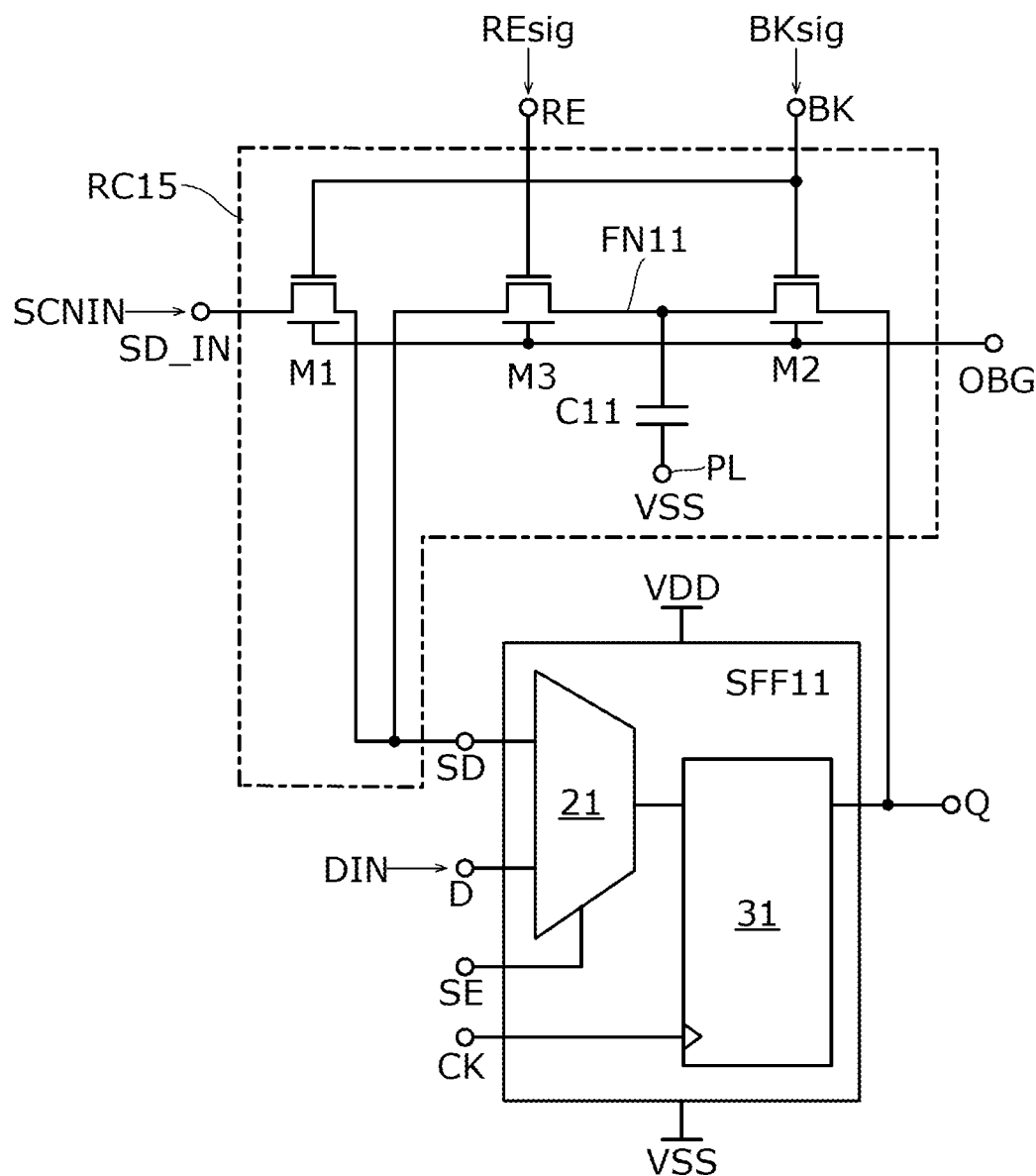
FIG. 11 is a circuit diagram illustrating a structure example of an SFF.
Figure 12:
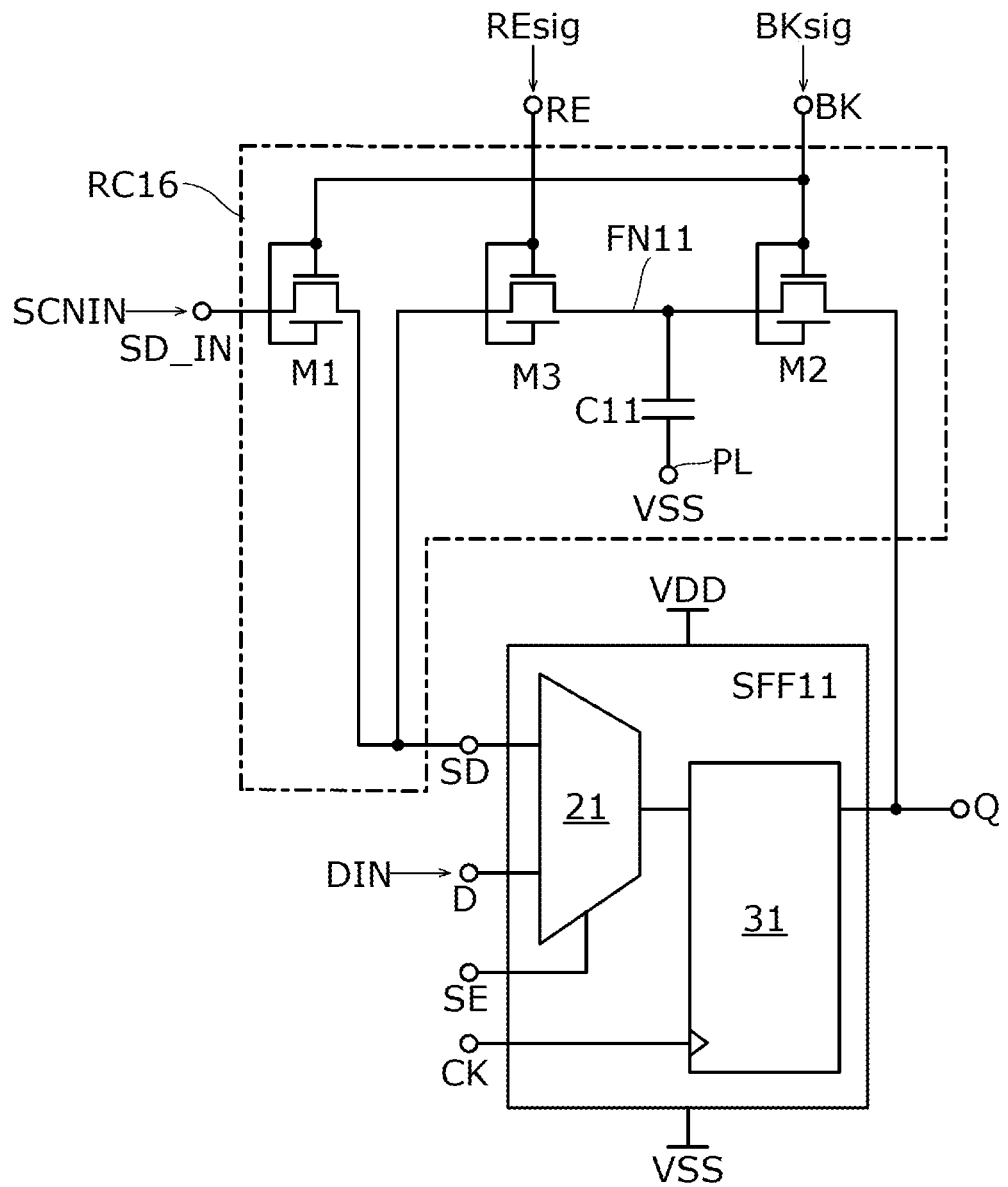
FIG. 12 is a circuit diagram illustrating a structure example of an SFF.

An SFF 115 in FIG. 11 includes a circuit RC15 and the SFF 11. An SFF 116 in FIG. 12 includes a circuit RC16 and the SFF 11. The circuit RC15 and the circuit RC16 are modifications of the circuit RC11, which include the transistors M1 to M3 with back gates.

In the circuit RC15, the back gates of the transistors M1 to M3 are electrically connected to a terminal OBG. A signal or a fixed potential can be input to OBG. Alternatively, a capacitor may be connected to OBG. This capacitor may be charged so that the voltage of the back gates of the transistors M1 to M3 can be held. For example, the threshold voltage of the transistors M1 to M3 can be adjusted in accordance with the voltage of the back gates of the transistors M1 to M3.

In the circuit RC16, the back gates are electrically connected to the gates of the transistors M1 to M3. Such a device structure can improve on-state current characteristics of the transistors M1 to M3.

In the circuit RC15, the transistors M1 to M3 include the back gates; however, some of the transistors M1 to M3 do not necessarily include the back gates. In the case where the transistor M1 includes the back gate, the back gate may be connected to the terminal OBG or may be electrically connected to the gate of the transistor M1. The same applies to the transistors M2 and M3. Moreover, the same applies to the circuit RC16.

<Structure Example of Processing Unit>

Figure 13:
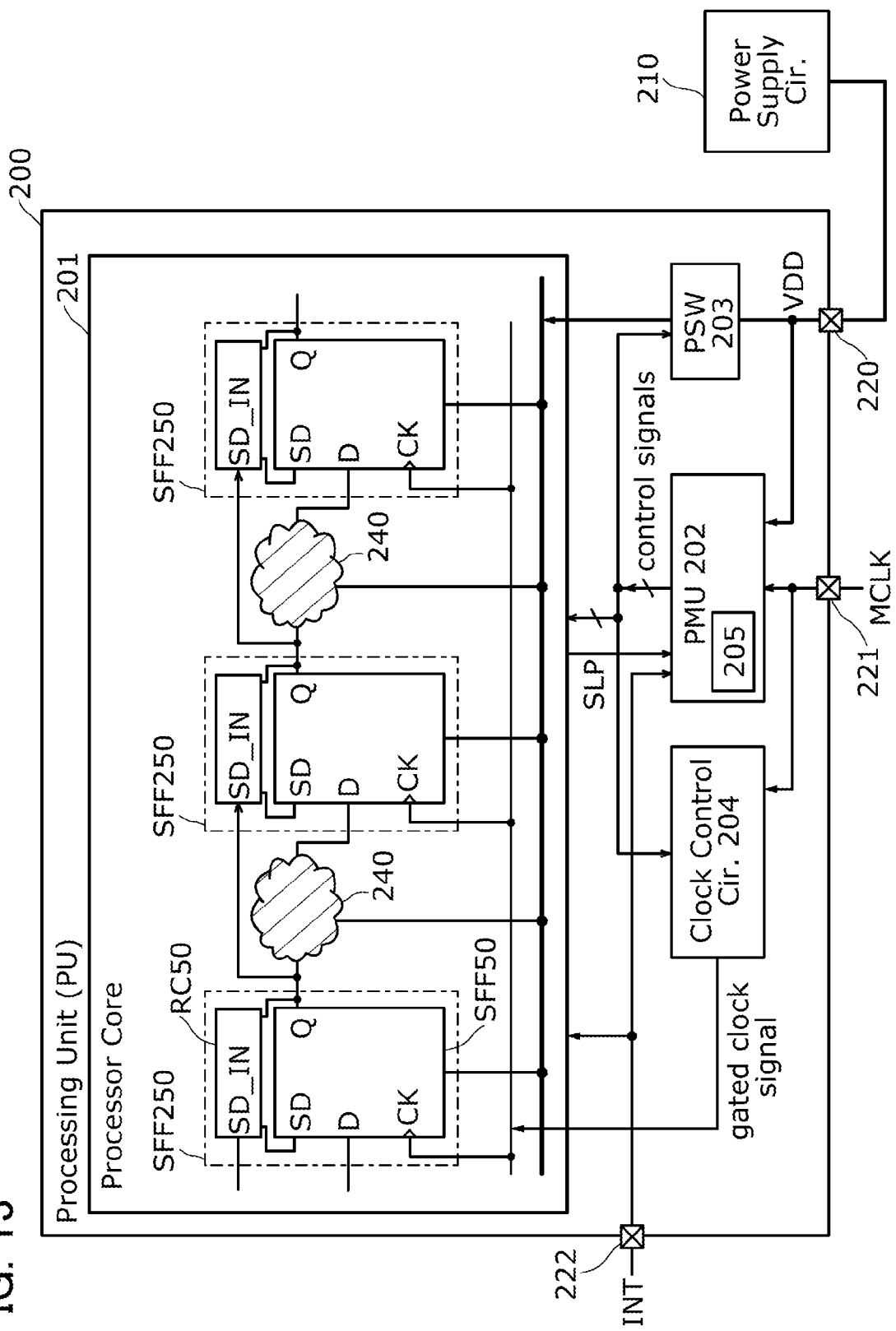
FIG. 13 is a block diagram illustrating a structure example of a processing unit.

An example of a semiconductor device including a scan FF is described. A semiconductor device in FIG. 13 includes a processing unit (PU) 200 and a power supply circuit 210. The PU 200 has a function of executing an instruction. The PU 200 includes a plurality of functional circuits integrated over one chip. The PU 200 further includes a processor core 201, a power management unit (PMU) 202, a power switch (PSW) 203, and a clock control circuit 204. FIG. 13 illustrates an example in which the power supply circuit 210 is provided over a chip different from a chip over which the PU 200 is provided. A terminal 220 is a power supply terminal, and power supply voltage VDD is input from the power supply circuit 210 to the terminal 220. Terminals 221 and 222 are signal input terminals. A master clock signal MCLK is input to the terminal 221. A signal INT is input to the terminal 222. The signal INT is an interrupt signal for requesting interrupt processing. The signal INT is input to the processor core 201 and the PMU 202.

<Processor Core>

The processor core 201 is capable of executing an instruction and can also be referred to as an arithmetic processing circuit or a processor (processing unit). The processor core 201 includes a logic circuit 240, a scan FF (SFF) 250, and the like, and a variety of functional circuits are formed using these circuits. For example, the logic circuit 240 can be a combinational circuit. For example, the SFF 250 is included in a register. The SFF 250 includes an SFF 50 and a circuit RC50. The SFF 50 may function as a scan FF and can be formed using a scan FF prepared in a standard circuit library. The circuit RC50 is a backup retention circuit of the SFF 50, and any of the circuits RC11 to RC14 can be used as the circuit RC50. The terminal Q of the SFF 250 is electrically connected to an input terminal of the logic circuit 240 and is also electrically connected to the terminal SD_IN of another SFF 250 to form a scan chain. The SFF 250 enables clock gating and power gating of the processor core 201; thus, the power consumption of the PU 200 can be reduced.

Figure 14:
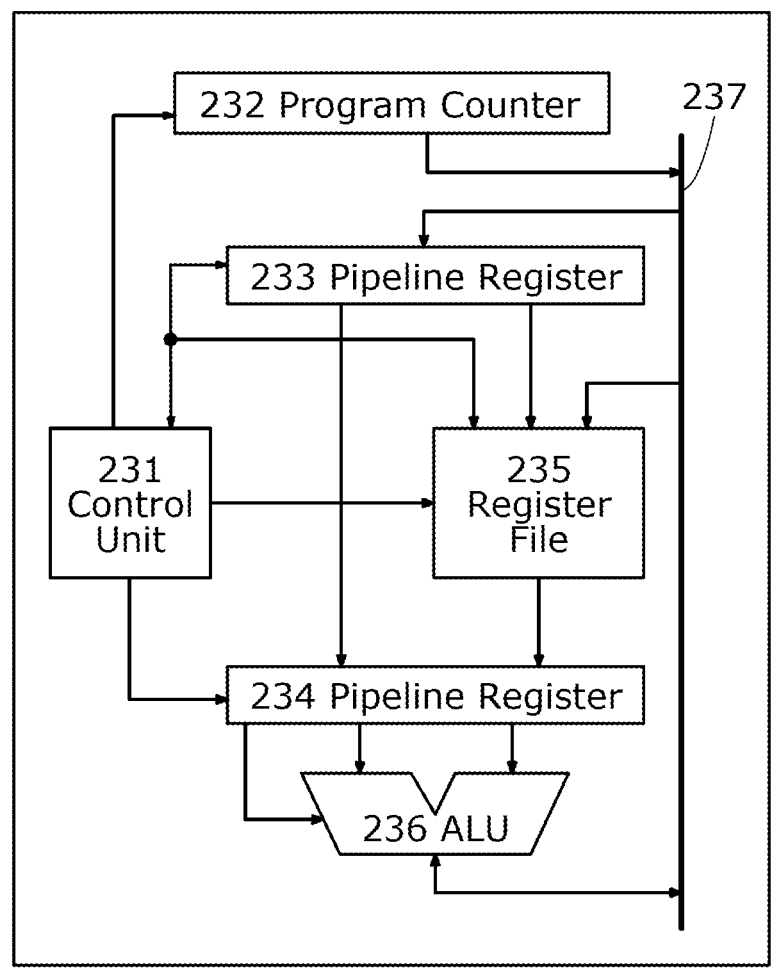
FIG. 14 is a block diagram illustrating a structure example of a processor core.

FIG. 14 illustrates a structure example of the processor core 201. The processor core 201 in FIG. 14 includes a control unit 231, a program counter 232, a pipeline register 233, a pipeline register 234, a register file 235, an arithmetic logic unit (ALU) 236, and a data bus 237. Data is transmitted between the processor core 201 and a peripheral circuit such as the PMU 202 or a cache through the data bus 237.

The control unit 231 has a function of decoding and executing instructions contained in a program such as input applications by controlling the overall operations of the program counter 232, the pipeline register 233, the pipeline register 234, the register file 235, the ALU 236, and the data bus 237. The ALU 236 has a function of performing a variety of arithmetic operations such as four arithmetic operations and logic operations. The program counter 232 is a register having a function of storing the address of an instruction to be executed next.

The pipeline register 233 has a function of temporarily storing instruction data. The register file 235 includes a plurality of registers including a general-purpose register and can store data read from a main memory, data obtained as a result of arithmetic operations in the ALU 236, or the like. The pipeline register 234 has a function of temporarily storing data used for arithmetic operations performed in the ALU 236, data obtained as a result of arithmetic operations in the ALU 236, or the like.

<Power Management>

The PMU 202 has a function of controlling power gating, clock gating, and the like. Specifically, the PMU 202 is capable of controlling the processor core 201, the PSW 203, and the clock control circuit 204. The PMU 202 has a function of outputting control signals such as BKsig, REsig, and SEsig to the processor core 201.

The PMU 202 includes a circuit 205. The circuit 205 is capable of measuring time. The PMU 202 is capable of performing power management on the basis of data on time obtained by the circuit 205. For example, when the circuit 205 is a timer circuit, the PMU 202 may generate a timer interrupt request signal. The circuit 205 is provided as necessary.

The PSW 203 is capable of controlling supply of VDD to the PU 200 in response to a control signal of the PMU 202. In the example of FIG. 13, the processor core 201 may include a plurality of power domains. In that case, supply of power to the plurality of power domains may be controlled independently by the PSW 203. In addition, the processor core 201 may include a power domain that is not power gated. In that case, VDD may be supplied to this power domain without the PSW 203.

The clock control circuit 204 has a function of generating and outputting a gated clock signal from the signal MCLK. The clock control circuit 204 is capable of stopping supply of a clock signal to the processor core 201 in response to a control signal of the PMU 202. The power supply circuit 210 may be capable of changing the magnitude of VDD in response to a control signal of the PMU 202.

A signal SLP is output from the processor core 201 to the PMU 202. The signal SLP is a trigger signal for transferring the processor core 201 to the sleep mode. In the processor core 201, the backup sequence of the SFF 250 is executed in response to the signal SLP. The backup sequence of the SFF 250 can be executed in a manner similar to the backup sequence of the SFF 110 in FIG. 6. When the signal SLP is input to the PMU 202, the PMU 202 outputs a control signal for transition from the active mode to the sleep mode to a functional circuit to be controlled. The PMU 202 controls the clock control circuit 204 and stops supply of a clock signal to the processor core 201. In addition, the PMU 202 controls the PSW 203 and stops supply of power to the processor core 201.

Processing for restoring the processor core 201 from the sleep mode to the active mode is executed by input of the signal INT. In the processor core 201, the restore sequence of the SFF 250 is executed in response to the signal INT. The restore sequence of the SFF 250 can be executed in a manner similar to the restore sequence of the SFF 110 in FIG. 7. When the signal INT is input to the PMU 202, the PMU 202 outputs a control signal for transition from the sleep mode to the active mode to a functional circuit to be controlled. The PMU 202 controls the PSW 203 and restarts supply of power to the processor core 201. In addition, the PMU 202 controls the clock control circuit 204 and restarts supply of a clock signal to the processor core 201.

The backup sequence may be executed using the signal INT or an interrupt request signal of the PMU 202 as a trigger. Furthermore, the restore sequence may be executed using the interrupt request signal of the PMU 202 as a trigger.

<Device Structure of SFF 250>

Figure 15:
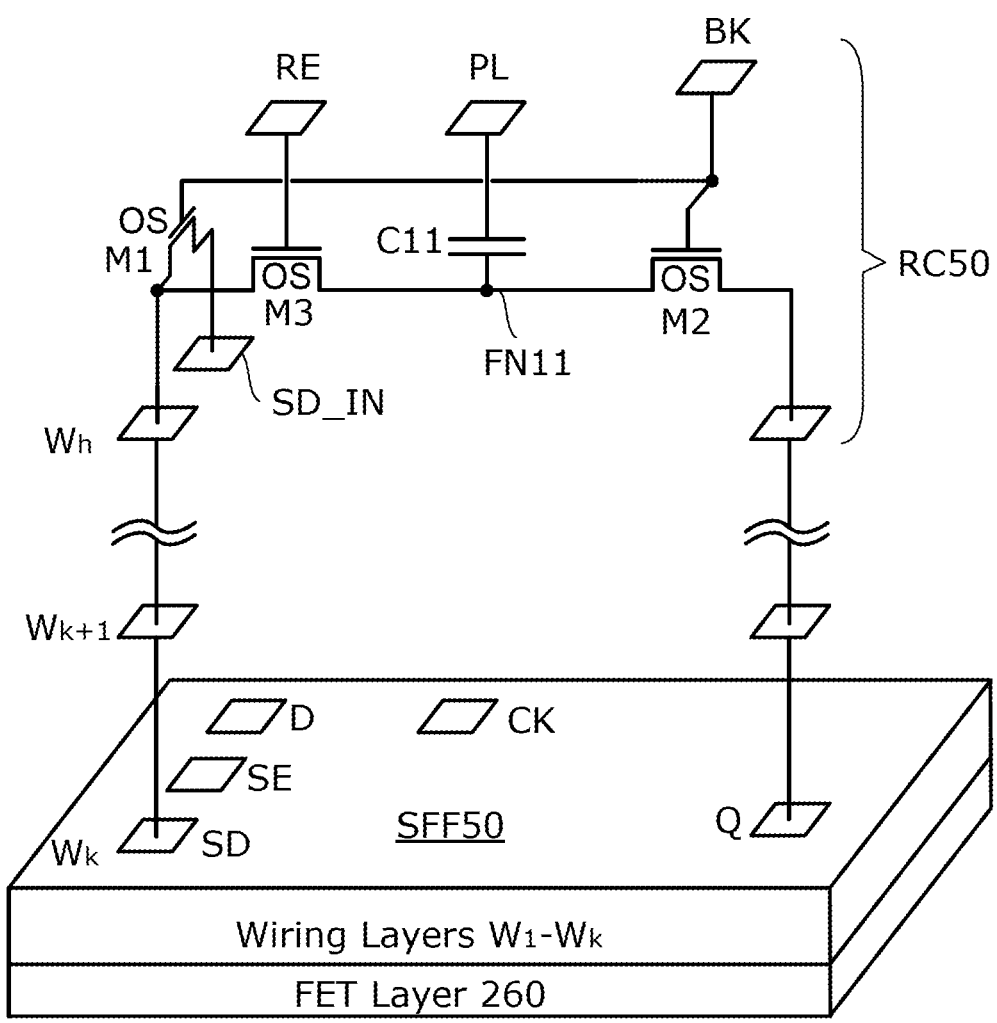
FIG. 15 illustrates a device structure of an SFF.

FIG. 15 illustrates the device structure of the SFF 250. In FIG. 15, the circuit RC50 has the same circuit structure as the circuit RC11 (FIG. 4). The transistors M1 to M3 are OS transistors. The SFF 250 can have a 3D device structure in which the circuit RC50 is stacked over the SFF 50. A first wiring layer, a k-th wiring layer, a (k+1)th wiring layer, and an h-th wiring layer are denoted by $W_1$, $W_k$, $W_{k+1}$, and $W_h$, respectively. Here, k is an integer of 1 or more and h is an integer of (k+2) or more. The terminals D, SD, Q, SE, and CK of the SFF 50 are provided in the wiring layer $W_k$, and the terminal SD_IN of the circuit RC50 is provided in the wiring layer $W_h$.

The transistors of the SFF 50 are provided in an FET layer 260. The transistors of the FET layer 260 may be formed by a standard CMOS process. Conductors of the wiring layers $W_1$ to $W_k$ electrically connect the transistors of the FET layer 260 to each other. Conductors of the wiring layers $W_{k+1}$ to $W_h$ electrically connect the SFF 50 to the circuit RC50.

The number of elements in the circuit RC50 is much smaller than the number of elements in the SFF 50; thus, there is no need to change the circuit structure and layout of the SFF 50 in order to stack the circuit RC50. In other words, the circuit RC50 is a backup circuit that has very broad utility. In addition, the circuit RC50 can be provided in a region where the SFF 50 is formed; thus, even when the circuit RC50 is included, the area overhead of the SFF 250 is zero.

<Integrated Circuit Including Circuit RC50>

In the processor core 201 in FIG. 13, the circuit RC50 does not affect the arrangement of the SFF 50, and the SFF 50 can be arranged so that scan test can be carried out efficiently. In other words, when the circuit RC50 is used as a backup circuit, an integrated circuit with a backup function can be designed easily and the ease of the test can be secured.

In the processor core 201, as in the SFF 50, another standard cell such as a NAND circuit is provided in the FET layer 260 and the wiring layers $W_1$ to $W_k$. Conductors for connecting the circuit RC50 to the terminals SD and Q are formed in the wiring layers $W_1$ to $W_k$; thus, it is necessary to lay out wirings of other standard cells by diverting the wirings around these conductors. Accordingly, the area of the processor core 201 is increased in some cases. The SFF 250 is a kind of standard cell included in the processor core 201 in many cases; however, the area overhead of the SFF 250 due to the circuit RC50 is zero. Thus, the increase in the area of the processor core 201 is due to the change in the layout of wirings between the other standard cells, and the area overhead of the processor core 201 can be less than several percent. This fact is confirmed by designing a processor core including the circuit RC50. Simulation indicates that the power consumption of the processor core including the circuit RC50 can be reduced.

<Area and Power of Processor Core>

A processor core that includes a scan FF including the circuit RC50 is designed. This processor core is referred to as an OS-FF-mounted processor, and the scan FF including the circuit RC50 is referred to as an OS-FF. For comparison, a CPU core that includes a scan FF without including the circuit RC50 is designed. This processor core is referred to as a Si-FF-mounted processor.

The designed processor core is a RISC processor core. The OS-FF-mounted processor and the Si-FF-mounted processor have the same circuit structure except the presence or absence of the circuit RC50. Circuits other than the circuit RC50 are formed using Si transistors. The processor core is designed by a design rule with a Si transistor channel length of 60 nm and an OS transistor channel length of 60 nm. The area of the Si-FF-mounted processor is 275 µm×272 µm, and the area of the OS-FF-mounted processor is 275 µm×272 µm. The scan FF accounts for approximately half of the logic circuit of the processor core. Even when each scan FF of the OS-FF-mounted processor includes the circuit RC50, area overhead is as small as 3%.

Simulation indicates that the dynamic power of the Si-FF-mounted processor at a power supply voltage of 1.2 V is 19 µA/MHz, the dynamic power of the OS-FF-mounted processor is also 19 µA/MHz, and that dynamic power is not increased due to addition of the circuit RC50. In addition, standby power of the OS-FF-mounted processor when power gating is performed is estimated at 0.03 µA.

The performance of the designed OS-FF is verified through simulation. In the case where the channel length of the OS transistor is 65 nm and the threshold voltage of the OS transistor is 1.6 V, the retention time of the OS-FF at room temperature is more than 30 days. In other words, in the sleep period of the OS-FF-mounted processor, the OS-FF has adequate retention performance as a nonvolatile storage circuit.

In the simulation, the backup time and the restore time of the OS-FF at an operating frequency of 50 MHz are each 2 clocks. The overhead time of the OS-FF-mounted processor due to power gating operation is sufficiently short; thus, the OS-FF does not decrease the performance of the processor.

The power reduction effect of the OS-FF-mounted processor that is caused by power gating is verified through simulation. Power consumption is estimated in operating conditions where an active period is 1 ms and a sleep period is 1 ms, 1 s, or 100 s. Power supply voltage is 1.2 V. Power consumption in an operating condition 1 (the active period: 1 ms, the sleep period: 1 ms) is 570 µW. Power consumption in an operating condition 2 (the active period: 1 ms, the sleep period: 1 s) is 1.2 µW. Power consumption in an operating condition 3 (the active period: 1 ms, the sleep period: 100 s) is 0.05 µW. Power gating in the sleep period can reduce the power consumption of the OS-FF-mounted processor effectively.

When the scan FF in this embodiment includes a retention circuit, for example, the following beneficial effects can be obtained. The area overhead of the scan FF due to the retention circuit can be zero. The retention circuit makes power consumption in normal operation almost zero and hardly decreases normal operation performance. Backup operation and restore operation can be performed at low power and high speed. Data can be retained without supply of power. In addition, the scan FF can be designed by directly using a scan FF of a circuit library; thus, the scan FF can be designed easily. Consequently, an integrated circuit including the scan FF does not decrease the ease of test even when the scan FF forms a scan chain.

In this manner, the scan FF is highly suitable for normally-off computing. Even when the scan FF is included, the dynamic power of the integrated circuit can hardly be increased and the performance of the integrated circuit can hardly be decreased. Thus, the integrated circuit including the scan FF can reduce power consumption effectively by power gating while keeping the performance.

Here, the sequential circuit is the scan FF; however, even another sequential circuit can have the above effects.

Embodiment 3

In this embodiment, an electronic component and electronic devices and the like including the electronic component are described as examples of a semiconductor device.

<Example of Manufacturing Method of Electronic Component>

Figure 16A:
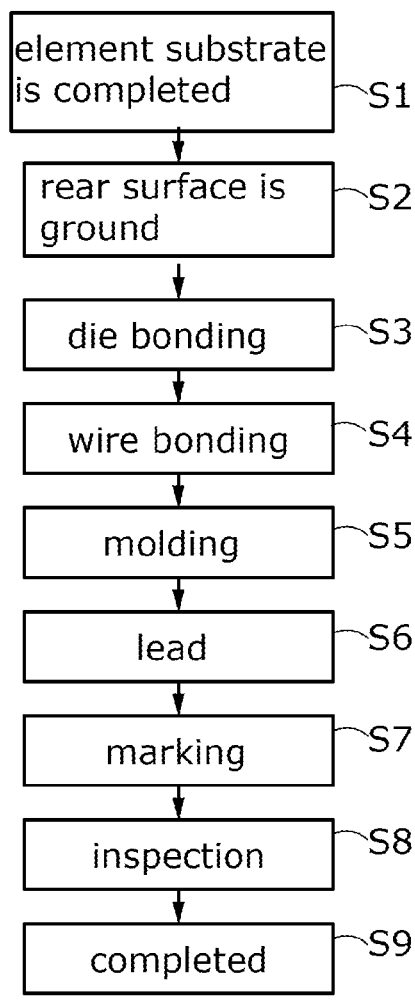
FIG. 16A is a flow chart showing an example of a method for manufacturing an electronic component.

FIG. 16A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed wiring board through an assembly process (post-process). The post-process can be finished through steps in FIG. 16A. Specifically, after an element substrate obtained in a wafer process is completed (Step S1), a rear surface of the substrate is ground (Step S2). The substrate is thinned in this step to reduce warpage or the like of the substrate in the wafer process and to reduce the size of the electronic component.

The rear surface of the substrate is ground so that the substrate is divided into a plurality of chips in a dicing process. The divided chips are separately picked up to be mounted on and bonded to a lead frame in a die bonding step (Step S3). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (Step S4). A silver line or a gold line can be used as the metal fine line. Either ball bonding or wedge bonding may be used as wire bonding.

A molding step is performed to seal the wire bonded chip with an epoxy resin or the like (Step S5). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (Step S6). This plating process prevents rust of the lead and facilitates soldering at the time of mounting the chip on a printed wiring board in a later step. Printing (marking) is performed on a surface of the package (Step S7). Through an inspection step (Step S8), the electronic component is completed (Step S9). When the electronic component includes the semiconductor device described in the above embodiment, a low-power small electronic component can be provided.

Figure 16B:
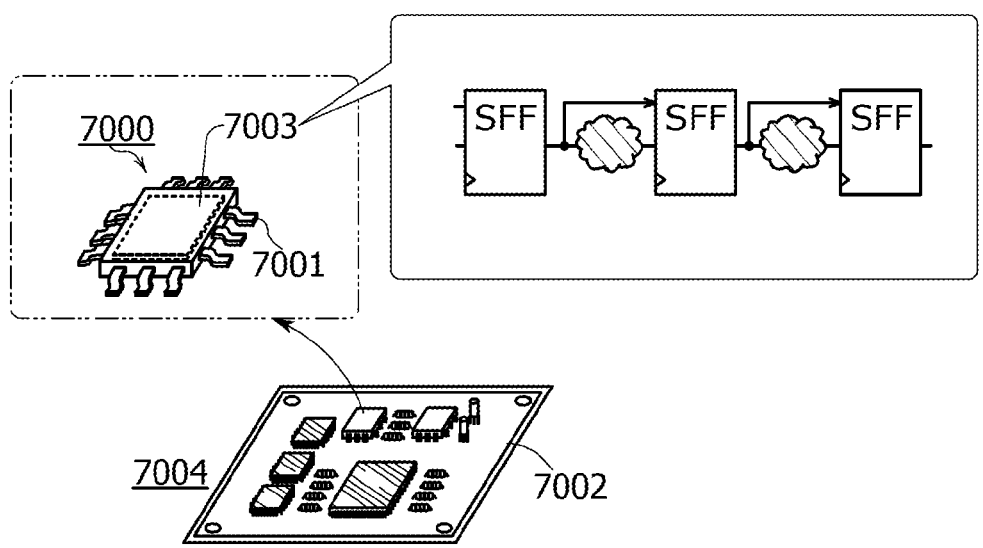
FIG. 16B is a schematic perspective view illustrating a structure example of the electronic component.

FIG. 16B is a schematic perspective view of the completed electronic component. FIG. 16B illustrates a schematic perspective view of a quad flat package (QFP) as an example of the electronic component. As illustrated in FIG. 16B, an electronic component 7000 includes a lead 7001 and a circuit portion 7003. In the circuit portion 7003, for example, the scan FFs (SFF) and other logic circuits described in Embodiment 2 are formed. The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. The electronic component 7000 can be used as, for example, a random access memory that stores data or a processing unit that executes a variety of processings, such as a CPU, a microcontroller unit (MCU), an FPGA, or a wireless IC. When an electronic device includes the electronic component 7000, the power consumption of the electronic device can be reduced. Alternatively, the electronic device can be have smaller size.

The electronic component 7000 can be used as an electronic component (IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include display devices, personal computers (PC), and image reproducing devices provided with recording media (devices which reproduce the content of recording media such as DVDs, Blu-ray discs, flash memories, and HDDs, and displays for displaying images). Other examples of an electronic device that can be equipped with the electronic component in one embodiment of the present invention include cellular phones, game machines including portable game machines, portable data appliances, e-book readers, cameras (e.g., video cameras and digital still cameras), wearable display devices (e.g., head mounted display devices, goggle-type display devices, glasses-type display devices, armband display devices, bracelet-type display devices, and necklace-type display devices), navigation systems, audio reproducing devices (e.g., car audio systems and digital audio players), copiers, facsimiles, printers, multifunction printers, automated teller machines (ATM), and vending machines. FIGS. 17A to 17F illustrate specific examples of such electronic devices.

Figure 17A:
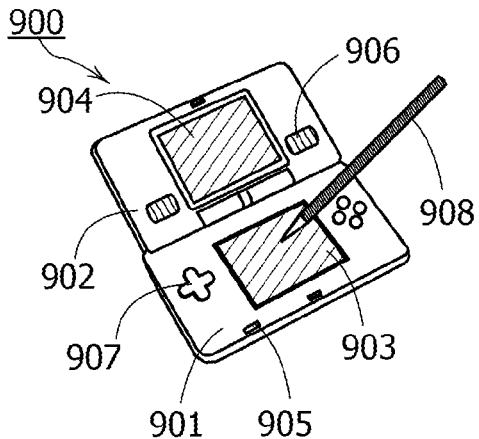
FIGS. 17A to 17F each illustrate an example of an electronic device.

A portable game machine 900 in FIG. 17A includes a housing 901, a housing 902, a display portion 903, a display portion 904, a microphone 905, a speaker 906, an operation key 907, a stylus 908, and the like.

Figure 17B:
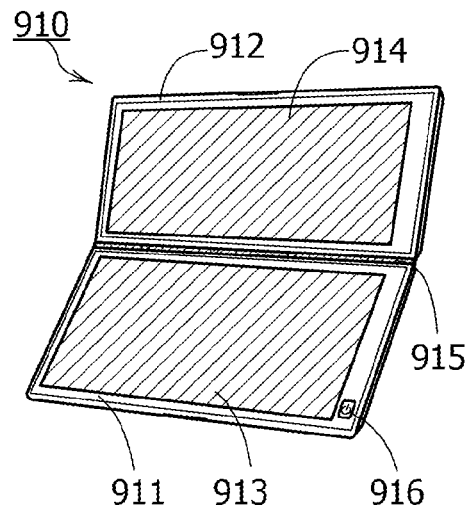

A portable information terminal 910 in FIG. 17B includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. An image displayed on the display portion 913 may be switched depending on the angle between the housings 911 and 912 at the joint 915. A display device with a touch panel may be used as the display portion 913 and/or the display portion 914.

Figure 17C:
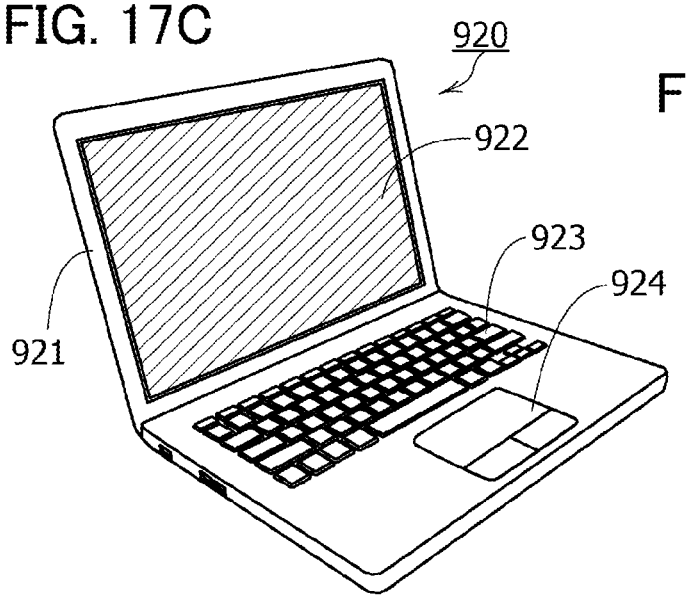

A laptop 920 in FIG. 17C includes a housing 921, a display portion 922, a keyboard 923, a pointing device 924, and the like.

Figure 17D:
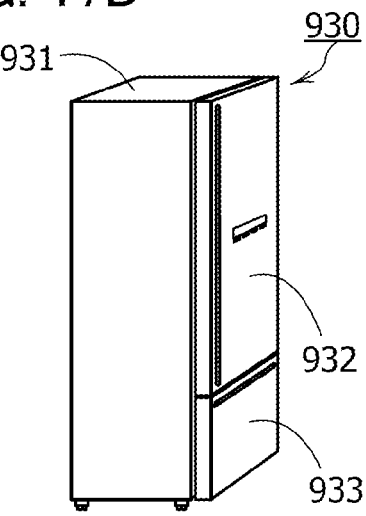

An electric refrigerator-freezer 930 in FIG. 17D includes a housing 931, a refrigerator door 932, a freezer door 933, and the like.

Figure 17E:
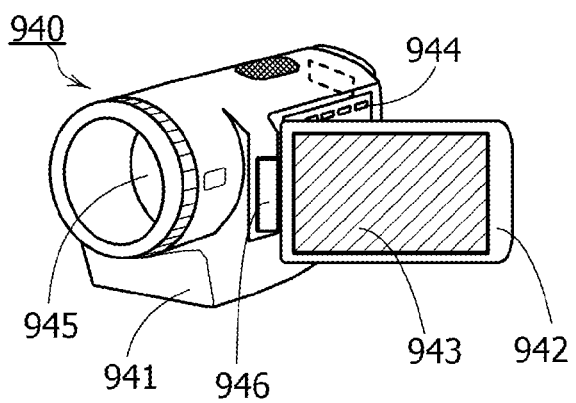

A video camera 940 in FIG. 17E includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image displayed on the display portion 943 may be changed and display and non-display of an image may be switched depending on the angle between the housings 941 and 942, for example.

Figure 17F:
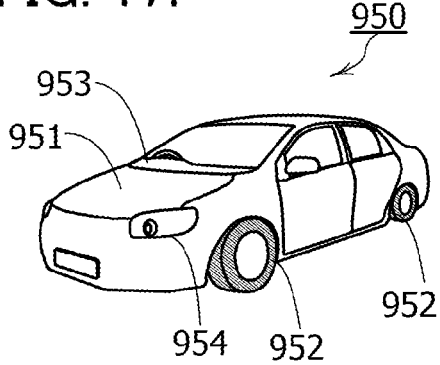

A motor vehicle 950 in FIG. 17F includes a car body 951, wheels 952, a dashboard 953, lights 954, and the like.

Embodiment 4

In this embodiment, an oxide semiconductor, an OS transistor, and the like are described.

<OS Transistor Structure Example 1>

Figure 18A:
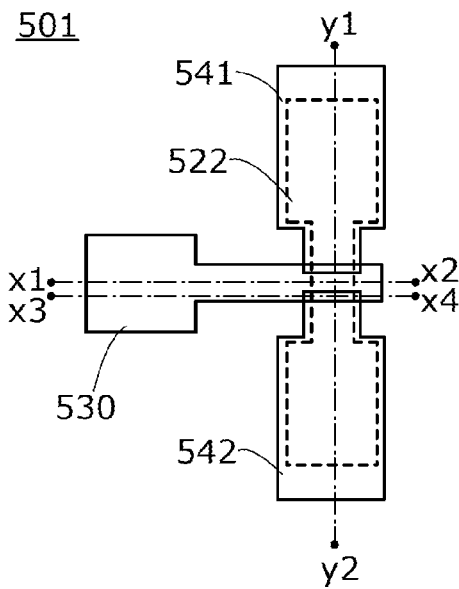
FIG. 18A is a plan view illustrating a structure example of a transistor.
Figure 18B:
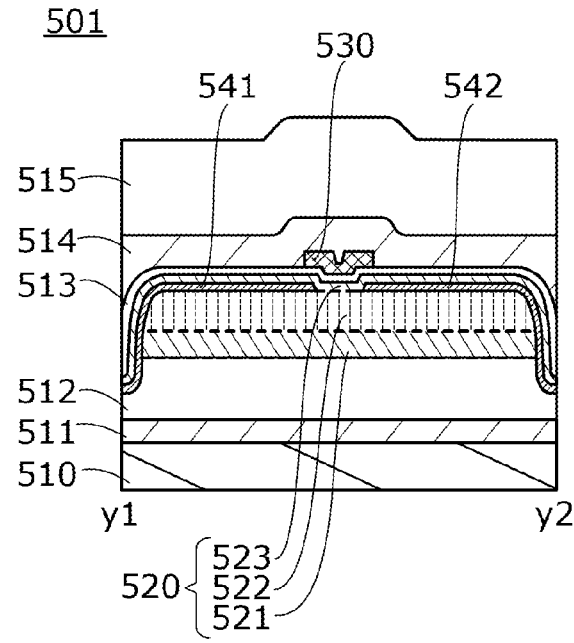
FIGS. 18B to 18D are cross-sectional views of the transistor in FIG. 18A.
Figure 18C:
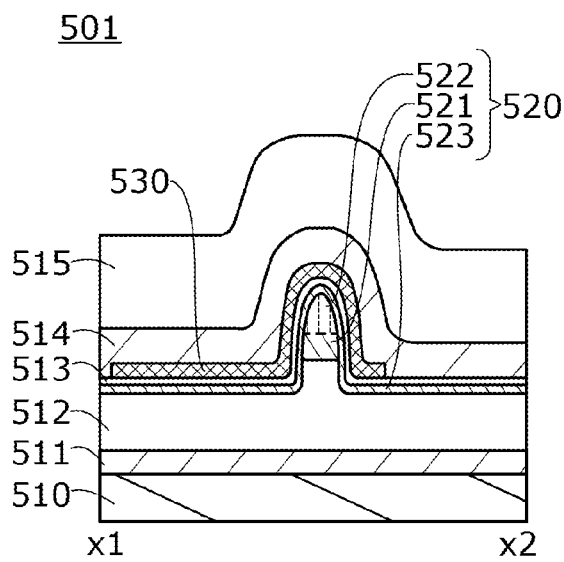
Figure 18D:
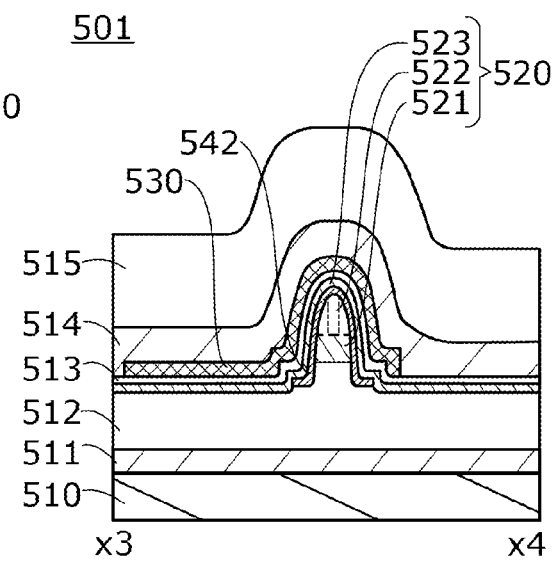

FIGS. 18A to 18D illustrate a structure example of an OS transistor. FIG. 18A is a top view illustrating a structure example of an OS transistor. FIG. 18B is a cross-sectional view taken along line y1-y2 in FIG. 18A. FIG. 18C is a cross-sectional view taken along line x1-x2 in FIG. 18A. FIG. 18D is a cross-sectional view taken along line x3-x4 in FIG. 18A. In some cases, the direction of line y1-y2 is referred to as a channel length direction, and the direction of line x1-x2 is referred to as a channel width direction. Accordingly, FIG. 18B illustrates a cross-sectional structure of the OS transistor in the channel length direction, and FIGS. 18C and 18D each illustrate a cross-sectional structure of the OS transistor in the channel width direction. Note that to clarify the device structure, FIG. 18A does not illustrate some components.

An OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 can be regarded as components of the OS transistor 501. The OS transistor 501 includes an insulating layer 512, an insulating layer 513, oxide semiconductor (OS) layers 521 to 523, a conductive layer 530, a conductive layer 541, and a conductive layer 542. The insulating layer 513 includes a region functioning as a gate insulating layer. The conductive layer 530 functions as a gate electrode. The conductive layer 531 functions as a back gate electrode. Here, the OS layers 521 to 523 are collectively referred to as an OS layer 520.

As illustrated in FIGS. 18B and 18C, the OS layer 520 includes a region where the OS layer 521, the OS layer 522, and the OS layer 523 are stacked in that order. The insulating layer 513 covers this stack region. The conductive layer 531 overlaps with the stack region with the insulating layer 513 positioned therebetween. The conductive layer 541 and the conductive layer 542 are provided over the stacked layer formed of the OS layer 521 and the OS layer 523 and are in contact with a top surface of this stacked layer and a side surface positioned in the channel length direction of the stacked layer. In the example of FIGS. 18A to 18D, the conductive layers 541 and 542 are also in contact with the insulating layer 512. The OS layer 523 is formed to cover the OS layers 521 and 522 and the conductive layers 541 and 542. A bottom surface of the OS layer 523 is in contact with a top surface of the OS layer 522.

The conductive layer 530 is formed to surround, in the channel width direction, the region where the OS layers 521 to 523 are stacked in the OS layer 520 with the insulating layer 513 positioned therebetween (see FIG. 18C). Therefore, a gate electric field in a vertical direction and a gate electric field in a lateral direction are applied to this stack region. In the OS transistor 501, the gate electric field refers to an electric field generated by voltage applied to the conductive layer 530 (gate electrode layer). Accordingly, the whole stack region of the OS layers 521 to 523 can be electrically surrounded by the gate electric fields, so that a channel is formed in the whole OS layer 522 (bulk) in some cases. Thus, the OS transistor 501 can have high on-state current.

In this specification, the structure of a transistor in which a semiconductor is electrically surrounded by a gate electric field as in the above transistor is referred to as a surrounded channel (s-channel) structure. The OS transistor 501 has the s-channel structure. With this s-channel structure, a large amount of current can flow between the source and the drain of the transistor, so that high drain current in an on state (on-state current) can be achieved.

The s-channel structure of the OS transistor 501 allows a gate electric field to be applied also to the side surface of the OS layer 522, so that a channel formation region is easily controlled. In the structure where the conductive layer 530 reaches below the OS layer 522 and faces the side surface of the OS layer 521, higher controllability can be achieved, which is preferable. Consequently, the subthreshold swing (S value) of the OS transistor 501 can be made small, so that a short-channel effect can be reduced. Thus, the s-channel structure is appropriate for miniaturization.

When an OS transistor has a three-dimensional structure as in the OS transistor 501, the channel length can be less than 100 nm. By miniaturization of the OS transistor, circuit area can be made small. The channel length of the OS transistor is preferably less than 65 nm, more preferably less than or equal to 30 nm or less than or equal to 20 nm. The channel length is at least 10 nm.

A conductor functioning as a gate of a transistor, a conductor functioning as a source of a transistor, and a conductor functioning as a drain of a transistor are referred to as a gate electrode, a source electrode, and a drain electrode, respectively. A region functioning as a source of a transistor and a region functioning as a drain of a transistor are referred to as a source region and a drain region, respectively. In this specification, a gate electrode might be referred to as a gate, a drain electrode or a drain region might be referred to as a drain, and a source electrode or a source region might be referred to as a source.

The channel length refers to, for example, a distance between a source and a drain in a region where a semiconductor (or a portion where current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Accordingly, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width, i.e., an apparent channel width or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate field-effect mobility, a current value per channel width, and the like of a transistor. In this case, the obtained value is sometimes different from the value obtained by using an effective channel width for the simulation.

<Substrate>

The substrate 510 is not limited to a simple supporting substrate and may be a substrate where a device such as a transistor is formed. In that case, one of the conductive layers 530, 541, and 542 of the OS transistor 501 may be electrically connected to the device.

<Base Insulating Layer>

The insulating layer 511 has a function of preventing impurity diffusion from the substrate 510. The insulating layer 512 preferably has a function of supplying oxygen to the OS layer 520. For this reason, the insulating layer 512 is preferably an insulating film containing oxygen, more preferably, an insulating film containing oxygen in which the oxygen content is higher than that in the stoichiometric composition. For example, a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) to have a flat surface.

The insulating layers 511 and 512 can be formed using an insulating material of aluminum oxide, aluminum oxynitride, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, silicon nitride, aluminum nitride oxide, or the like, or a mixed material of these materials.

<Gate Electrode>

The conductive layer 530 is preferably formed using a metal such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), or platinum (Pt); an alloy of any of these metals; or a compound containing any of these metals as its main component.

The conductive layer 530 may have a single-layer structure or a layered structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

<Gate Insulating Layer>

The insulating layer 513 is formed using an insulating film having a single-layer structure or a layered structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 511 contains oxygen, nitrogen, silicon, hafnium, or the like, for example. Specifically, the insulating layer 511 preferably contains hafnium oxide, and silicon oxide or silicon oxynitride.

Hafnium oxide has a higher dielectric constant than silicon oxide and silicon oxynitride. Therefore, the insulating layer 513 using hafnium oxide can have larger thickness than the insulating layer 513 using silicon oxide, so that leakage current due to tunnel current can be reduced. That is, a transistor with low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

<Source Electrode, Drain Electrode, Back Gate Electrode>

The conductive layers 541 and 542 can be formed in a manner similar to that of the conductive layer 530. A Cu—Mn alloy film is preferably used for the conductive layers 541 and 542 because of its low electrical resistance, because it can form manganese oxide at the interface with an oxide semiconductor film when formed in contact with the oxide semiconductor film, and because manganese oxide can prevent Cu diffusion. Furthermore, the conductive layer 531 described later (see FIG. 20A) can be formed in a manner similar to that of the conductive layer 530.

<Protective Insulating Film>

The insulating layer 514 preferably has a function of blocking oxygen, hydrogen, water, an alkali metal, an alkaline earth metal, and the like. The insulating layer 514 can prevent outward diffusion of oxygen from the OS layer 520 and entry of hydrogen, water, or the like into the OS layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be used.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the OS layer 520, preventing release of oxygen, which is the main component of the OS layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a layered structure. The insulating layer can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<Oxide Semiconductor Layer>

As the semiconductor material of the OS layers 521 to 523, typically, an In—Ga oxide, an In—Zn oxide, or an In-M-Zn oxide (M is Ga, Y, Sn, Zr, La, Ce, Nd, or the like) is used. The element M is an element having high bonding energy with oxygen, for example. The element M is an element whose bonding energy with oxygen is higher than that of indium. Alternatively, the element M is an element that can increase the energy gap of the oxide semiconductor. In addition, the OS layers 521 to 523 are not limited to the oxide layers containing indium. The OS layers 521 to 523 can be formed using a Zn—Sn oxide layer, a Ga—Sn oxide layer, or a Zn—Mg oxide, for example. The OS layer 522 is preferably formed using an In-M-Zn oxide. The OS layers 521 and 523 can be formed using a Ga oxide.

The OS layer 522 is not limited to the oxide semiconductor containing indium. The OS layer 522 may be, for example, an oxide semiconductor which does not contain indium and contains at least one of zinc, gallium, and tin (e.g., a zinc tin oxide or a gallium tin oxide).

For the OS layer 522, an oxide with a wide energy gap may be used. The energy gap of the OS layer 522 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The OS layer 522 is preferably a CAAC-OS film to be described later. When the oxide semiconductor contains Zn, the oxide semiconductor is easily to be crystallized in some cases. Thus, the OS layer 522 preferably contains Zn.

When an interface level is formed at an interface between the OS layer 522 and the OS layer 521, a channel region is also formed in a region close to the interface; thus, the threshold voltage of the OS transistor 501 varies. It is preferable that the OS layer 521 contains at least one of the metal elements contained in the OS layer 522. Accordingly, an interface state is hardly formed at the interface between the OS layer 522 and the OS layer 523, and variations in the electrical characteristics of the OS transistor 501, such as the threshold voltage, can be reduced.

The OS layer 523 preferably contains at least one of the metal elements contained in the OS layer 522 because interface scattering is unlikely to occur at the interface between the OS layer 522 and the OS layer 523, and carrier transfer is not inhibited. Thus, the field-effect mobility of the OS transistor 501 can be increased.

The OS layers 521, 522, and 523 preferably include at least indium. In the case of using an In-M-Zn oxide as the OS layer 521, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. In the case of using an In-M-Zn oxide as the OS layer 522, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. In the case of using an In-M-Zn oxide as the OS layer 523, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. The OS layer 523 may be an oxide that is the same type as that of the OS layer 521. Alternatively, the OS layer 521 and/or the OS layer 523 does not necessarily contain indium in some cases. For example, the OS layer 521 and/or the OS layer 523 can be formed using gallium oxide.

It is preferable that the OS layer 522 have the highest carrier mobility among the OS layers 521 to 523. Accordingly, a channel can be formed in the OS layer 522 that is apart from the insulating layer 511.

For example, in an oxide containing In such as an In-M-Zn oxide, carrier mobility can be increase by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

When an oxide semiconductor film is deposited by sputtering, because of heating of a substrate surface (the surface on which the oxide semiconductor film is deposited), space heating, or the like, the composition of the film is sometimes different from that of a target as a source or the like. For example, in the case of using a target of an In—Ga—Zn oxide, since zinc oxide sublimates more easily than indium oxide, gallium oxide, or the like, the source and the In—Ga—Zn oxide are likely to have different compositions. Specifically, the content of Zn is lower than that of the source in the In—Ga—Zn oxide. Thus, a source is preferably selected taking into account the change in composition. Note that a difference between the compositions of the source and the film is also affected by pressure or gas used for the deposition as well as temperature.

In the case where the OS layer 522 is an In-M-Zn oxide formed by sputtering, it is preferable that the atomic ratio of metal elements of a target used for depositing the In-M-Zn oxide be In:M:Zn=1:1:1, 3:1:2, or 4:2:4.1. For example, the atomic ratio of metal elements contained in a semiconductor film deposited using a target of In:M:Zn=4:2:4.1 is approximately In:M:Zn=4:2:3.

In the case where each of the OS layers 521 and 523 is an In-M-Zn oxide formed by sputtering, it is preferable that the atomic ratio of metal elements of a target used for depositing the In-M-Zn oxide be In:M:Zn=1:3:2 or 1:3:4.

In the case where the oxide semiconductor film is formed by sputtering, a power source for generating plasma can be an RF power source, an AC power source, a DC power source, or the like as appropriate. As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased. Furthermore, a target may be selected as appropriate in accordance with the composition of the oxide semiconductor to be formed.

In order to obtain a highly purified intrinsic or substantially highly purified intrinsic oxide semiconductor film, it is necessary to highly purify a sputtering gas as well as to evacuate a chamber to a high vacuum. An oxygen gas or an argon gas used as a sputtering gas is highly purified to have a dew point of −40° C. or lower, preferably −80° C. or lower, more preferably −100° C. or lower, so that entry of moisture or the like into the oxide semiconductor can be prevented as much as possible.

<Energy Band Structure>

Figure 19A:
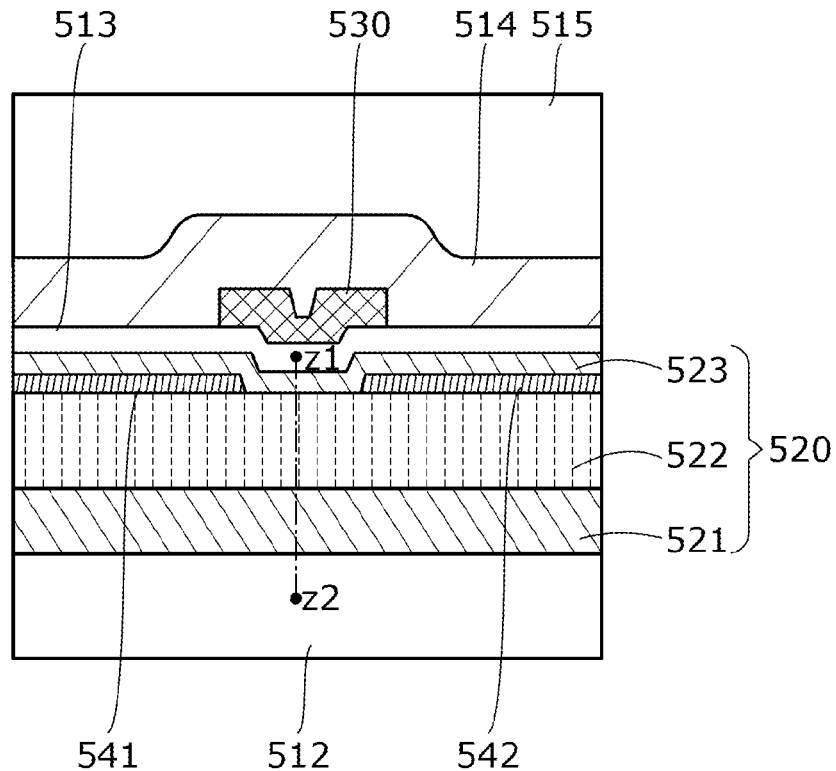
FIG. 19A is a partial enlarged view of the transistor in FIG. 18B.
Figure 19B:
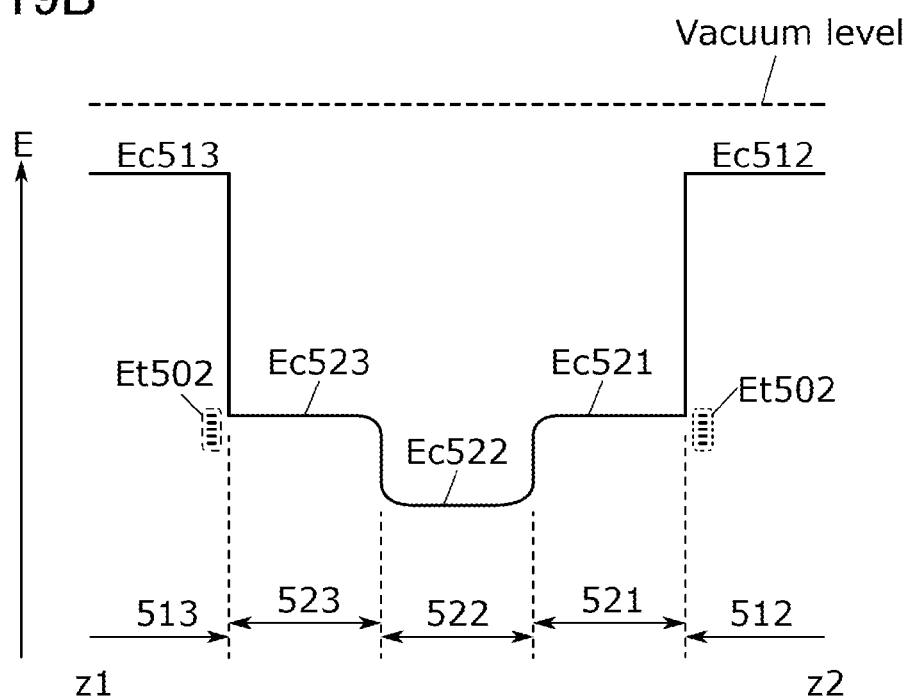
FIG. 19B is an energy band diagram of the transistor.

Next, the function and effect of the OS layer 520 in which the OS layers 521, 522, and 523 are stacked are described using an energy band diagram in FIG. 19B. FIG. 19A is a partial enlarged view of a channel region of the OS transistor 502 in FIG. 18B. FIG. 19B shows an energy band diagram of a portion taken along dotted line z1-z2 (the channel formation region of the OS transistor 502) in FIG. 19A. The OS transistor 501 is described below as an example, but the same applies to the OS transistors 502 to 506.

In FIG. 19B, Ec512, Ec521, Ec522, Ec523, and Ec513 indicate the energy at the bottom of the conduction band of the insulating layer 512, the OS layer 521, the OS layer 522, the OS layer 523, and the insulating layer 513, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a lower electron affinity than the OS layers 521, 522, and 523).

The OS layer 522 is an oxide layer having higher electron affinity than those of the OS layers 521 and 523. For example, as the OS layer 522, an oxide having an electron affinity higher than those of the OS layers 521 and 523 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

When voltage is applied to the gate (the conductive layer 530) of the OS transistor 501, a channel is formed in the OS layer 522 having the highest electron affinity among the OS layers 521 to 523.

An indium gallium oxide has low electron affinity and a high oxygen-blocking property. Therefore, the OS layer 523 preferably includes an indium gallium oxide. The gallium atomic ratio [Ga/(In+Ga)] is, for example, higher than or equal to 70%, preferably higher than or equal to 80%, more preferably higher than or equal to 90%.

Ec521 is closer to the vacuum level than Ec522. Specifically, Ec521 is preferably closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

In some cases, there is a mixed region of the OS layers 521 and 522 between the OS layers 521 and 522. Furthermore, in some cases, there is a mixed region of the OS layers 522 and 523 between the OS layers 522 and 523. Because the mixed region has low interface state density, a stack of the OS layers 521 to 523 (the OS layer 520) has a band structure where energy at each interface and in the vicinity of the interface is changed continuously (continuous junction).

Electrons transfer mainly through the OS layer 522 in the OS layer 520 having such an energy band structure. Therefore, even when an interface state exists at an interface between the OS layer 521 and the insulating layer 512 or an interface between the OS layer 523 and the insulating layer 513, electron movement in the OS layer 520 is less likely to be inhibited and the on-sate current of the OS transistor 501 can be increased.

Although trap states Et502 due to impurities or defects might be formed in the vicinity of the interface between the OS layer 521 and the insulating layer 512 and the vicinity of the interface between the OS layer 523 and the insulating layer 513 as illustrated in FIG. 19B, the OS layer 522 can be separated from the trap states owing to the existence of the OS layers 521 and 523. In the transistor 501, in the channel width direction, the top surface and side surfaces of the OS layer 522 are in contact with the OS layer 523, and the bottom surface of the OS layer 522 is in contact with the OS layer 521 (see FIG. 18C). Surrounding the OS layer 522 by the OS layers 521 and 523 in this manner can further reduce the influence of the trap states Et502.

However, when the energy difference between Ec522 and Ec521 or Ec523 is small, an electron in the OS layer 522 might reach the trap state by passing over the energy difference. Since the electron is trapped at the trap state, negative fixed charge is generated at the interface with the insulating film, causing the threshold voltage of the transistor to be shifted in a positive direction. Therefore, each of the energy gaps between Ec521 and Ec522 and between Ec522 and Ec523 is preferably 0.1 eV or more, more preferably 0.15 eV or more because a change in the threshold voltage of the OS transistor 501 can be reduced and the OS transistor 501 can have favorable electrical characteristics.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel region is large. The electron movement is also inhibited, for example, in the case where the density of defect states is high in the channel region.

To increase the on-state current of the OS transistor 501, for example, root mean square (RMS) roughness with a measurement area of 1 μm×1 μm of a top surface or a bottom surface of the OS layer 522 (a formation surface; here, the OS layer 521) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P-V) with the measurement area of 1 μm×1 μm is less than 10 nm, preferably less than 9 nm, more preferably less than 8 nm, still more preferably less than 7 nm.

For example, in the case where the OS layer 522 contains oxygen vacancies (Vo), donor levels are formed by entry of hydrogen into sites of oxygen vacancies in some cases. A state in which hydrogen enters sites of oxygen vacancies are denoted by VoH in the following description in some cases. VoH is a factor of decreasing the on-state current of the transistor because VoH scatters electrons. Note that sites of oxygen vacancies become more stable by entry of oxygen than by entry of hydrogen. Thus, by decreasing oxygen vacancies in the OS layer 522, the on-state current of the transistor can be increased in some cases. For example, at a certain depth in the OS layer 522 or in a certain region of the OS layer 522, the concentration of hydrogen measured by secondary ion mass spectrometry (SIMS) is set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

To decrease oxygen vacancies in the OS layer 522, for example, there is a method in which excess oxygen in the insulating layer 512 is moved to the OS layer 522 through the OS layer 521. In that case, the OS layer 521 is preferably a layer having an oxygen-transmitting property (a layer through which oxygen is transmitted).

In the case where the OS transistor 501 has an s-channel structure, a channel can be formed in the entire OS layer 522. The thickness of the OS layer 522 may be greater than or equal to 10 nm and less than or equal to 100 nm or greater than or equal to 10 nm and less than or equal to 30 nm.

The thickness of the OS layer 523 may be made small to increase the on-state current of the transistor. For example, the OS layer 523 has a region with a thickness of less than 10 nm, preferably less than or equal to 3 nm. Meanwhile, the OS layer 523 has a function of blocking entry of elements other than oxygen (such as hydrogen and silicon) included in the adjacent insulator into the OS layer 522. Thus, the OS layer 523 preferably has a certain thickness. For example, the OS layer 523 may have a region with a thickness of greater than or equal to 0.3 nm, preferably greater than or equal to 1 nm, more preferably greater than or equal to 2 nm. The OS layer 523 preferably has an oxygen blocking property to inhibit outward diffusion of oxygen released from the insulating layer 512 and the like.

To improve reliability, preferably, the thickness of the OS layer 521 is large and the thickness of the OS layer 523 is small. For example, the OS layer 521 has a region with a thickness of greater than or equal to 10 nm, preferably greater than or equal to 20 nm, more preferably greater than or equal to 40 nm, still more preferably greater than or equal to 60 nm. When the thickness of the OS layer 521 is made large, a distance from an interface between the adjacent insulator and the OS layer 521 to the OS layer 522 in which a channel is formed can be large. Since the productivity of the semiconductor device might be decreased, the OS layer 521 has a region with a thickness of, for example, less than or equal to 200 nm, preferably less than or equal to 120 nm, more preferably less than or equal to 80 nm.

In order that an OS transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to a state where an oxide semiconductor has a carrier density lower than $1\times10^{17}$/cm$^3$, preferably lower than $1\times10^{15}$/cm$^3$, more preferably lower than $1\times10^{13}$/cm$^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the OS layers 521, 522, and 523 and at interfaces between the OS layers.

In order to make the oxide semiconductor intrinsic or substantially intrinsic, for example, the concentration of silicon at a certain depth of the oxide semiconductor or in a region of the oxide semiconductor, which is measured by SIMS, is lower than $1\times10^{19}$ atoms/cm$^3$, preferably lower than $5\times10^{18}$ atoms/cm$^3$, more preferably lower than $1\times10^{18}$ atoms/cm$^3$. The concentration of hydrogen at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to reduce the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$, for example.

A transistor in which the above highly purified oxide semiconductor is used for a channel formation region exhibits extremely low off-state current. When voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 18A to 18D illustrate examples in which the OS layer 520 has a three-layer structure; however, one embodiment of the present invention is not limited thereto. For example, the OS layer 520 may have a two-layer structure without the OS layer 521 or 523. Alternatively, the OS layer 520 may have a four-layer structure in which any one of the oxide semiconductor layers described as the OS layers 521 to 523 is provided below or over the OS layer 521 or below or over the OS layer 523. Alternatively, the OS layer 520 may have an n-layer structure (n is an integer of 5 or more) in which any one of the oxide semiconductor layers described as the OS layers 521 to 523 is provided at two or more of the following positions: between given layers in the OS layer 520, over the OS layer 520, and below the OS layer 520.

<OS Transistor Structure Example 2>

Figure 20A:
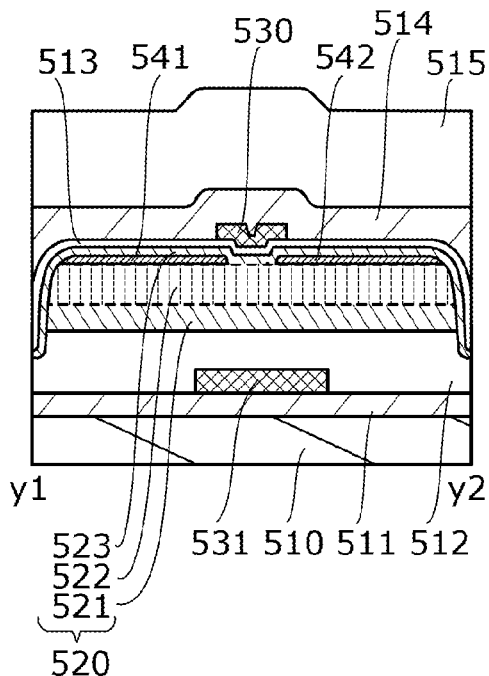
FIGS. 20A to 20C are cross-sectional views each illustrating a structure example of a transistor.

The OS transistor 502 in FIG. 20A is a modification example of the OS transistor 501. Like the OS transistor 501, the OS transistor 502 also has the s-channel structure. The OS transistor 502 differs from the OS transistor 501 in the shapes of the conductive layers 541 and 542 and in that the conductive layer 531 is provided over the insulating layer 511.

The conductive layer 531 functions as a back gate electrode. A constant potential, the same potential or signal supplied to the conductive layer 530, or a potential or signal that is different from that supplied to the conductive layer 530 may be supplied to the conductive layer 531. The conductive layers 541 and 542 function as a source electrode and a drain electrode.

The conductive layers 541 and 542 in the OS transistor 502 are formed using a hard mask used for forming the stack of the OS layers 521 and 522. Therefore, the conductive layers 541 and 542 do not have regions in contact with the side surfaces of the OS layers 521 and 522. For example, through the following steps, the OS layers 521 and 522 and the conductive layers 541 and 542 can be formed. A two-layer oxide semiconductor film including the OS layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the OS layers 521 and 522. Then, the hard mask is etched to form the conductive layers 541 and 542.

The conductive layer 531 can function as a back gate electrode of the OS transistor 502. The conductive layer 531 can be provided in the OS transistor 501 in FIGS. 20A to 20C, and OS transistors 503 to 506 (FIGS. 18A to 18D, FIGS. 19A and 19B, FIGS. 20A to 20C, and FIGS. 21A and 21B) to be described later.

<OS Transistor Structure Examples 3 and 4>

Figure 20B:
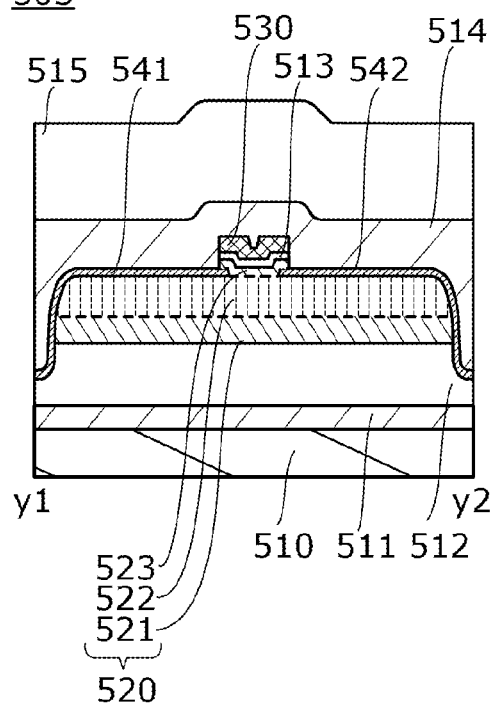
Figure 20C:
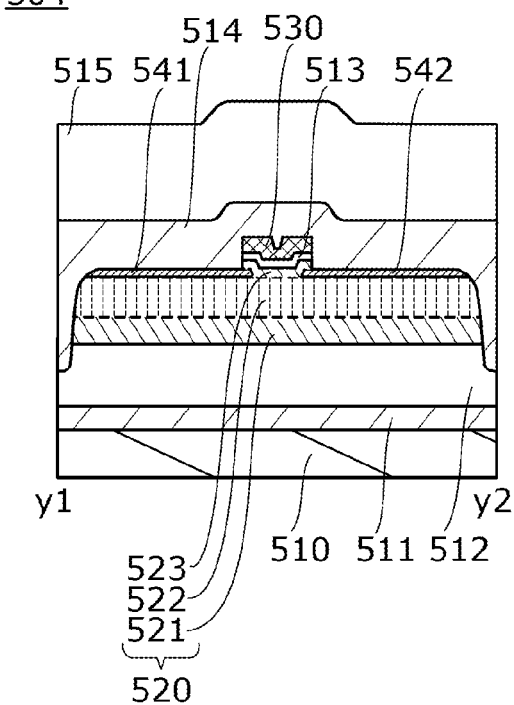

The OS transistor 503 in FIG. 20B is a modification example of the OS transistor 501, and the OS transistor 504 in FIG. 20C is a modification example of the OS transistor 502. In the OS transistors 503 and 504, the OS layer 523 and the insulating layer 513 are etched using the conductive layer 530 as a mask. Thus, an edge of the OS layer 523 and an edge of the insulating layer 513 are substantially aligned with an edge of the conductive layer 530.

<OS Transistor Structure Examples 5 and 6>

Figure 21A:
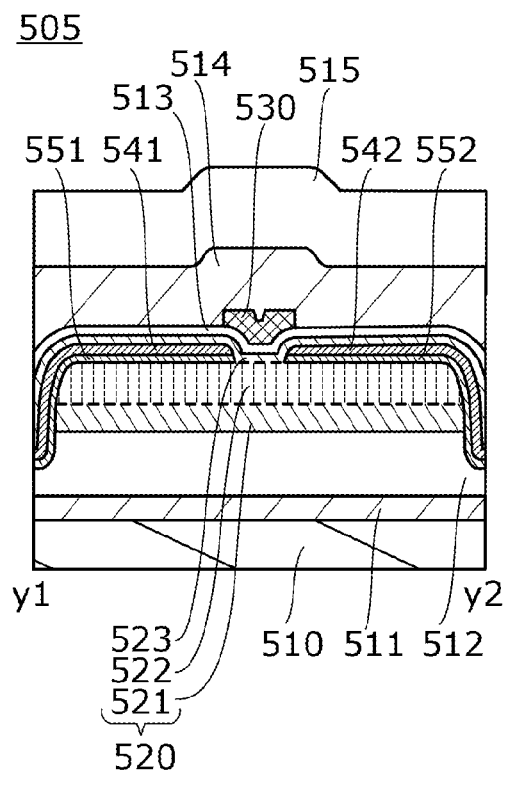
FIGS. 21A and 21B are cross-sectional views each illustrating a structure example of a transistor.
Figure 21B:
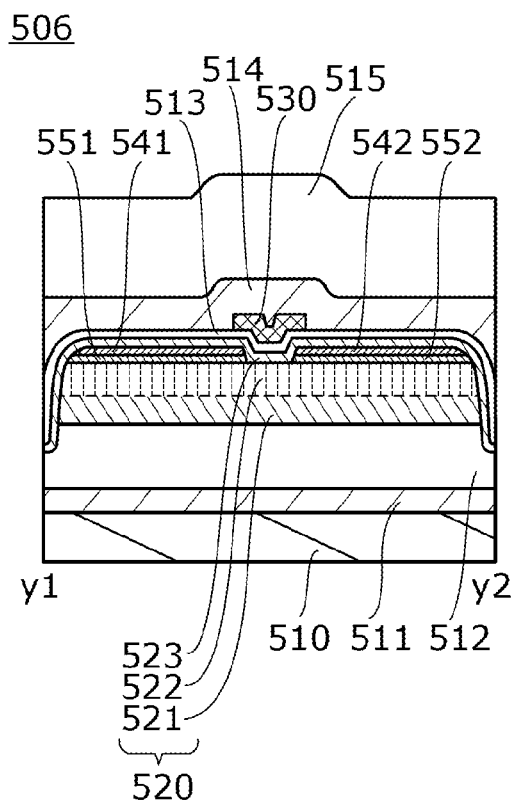

The OS transistor 505 in FIG. 21A is a modification example of the OS transistor 501, and the OS transistor 506 in FIG. 21B is a modification example of the OS transistor 502. The OS transistors 505 and 506 include a layer 551 between the OS layer 523 and the conductive layer 541 and a layer 552 between the OS layer 523 and the conductive layer 542.

The layers 551 and 552 can be formed using a transparent conductor, an oxide semiconductor, a nitride semiconductor, or an oxynitride semiconductor, for example. The layers 551 and 552 can be formed using an n-type oxide semiconductor layer or can be formed using a conductive layer that has higher resistance than the conductive layers 541 and 542. The layers 551 and 552 may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Alternatively, these layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress a change in electrical characteristics of the transistor due to stray light.

The layers 551 and 552 may preferably be formed using a layer that does not form a Schottky barrier with the OS layer 522. Accordingly, on-state characteristics of the OS transistors 505 and 506 can be improved.

The layers 551 and 552 preferably have higher resistance than the conductive layers 541 and 542. The resistance of the layers 551 and 552 is preferably lower than the channel resistance of the OS transistors 505 and 506. For example, the layers 551 and 552 preferably have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having resistivity within the above range can reduce electric field concentration in a boundary portion between the channel and the drain. Therefore, a change in electrical characteristics of the transistor can be suppressed. In addition, punch-through current generated by an electric field from the drain can be reduced. Thus, a transistor with small channel length can have favorable saturation characteristics. Note that in a circuit structure where the source and the drain of each of the OS transistors 505 and 506 do not interchange during operation, only one of the layers 551 and 552 (e.g., the layer on the drain side) is preferably provided according to circumstances.

<Chip Device Structure Example 1>

Figure 22:
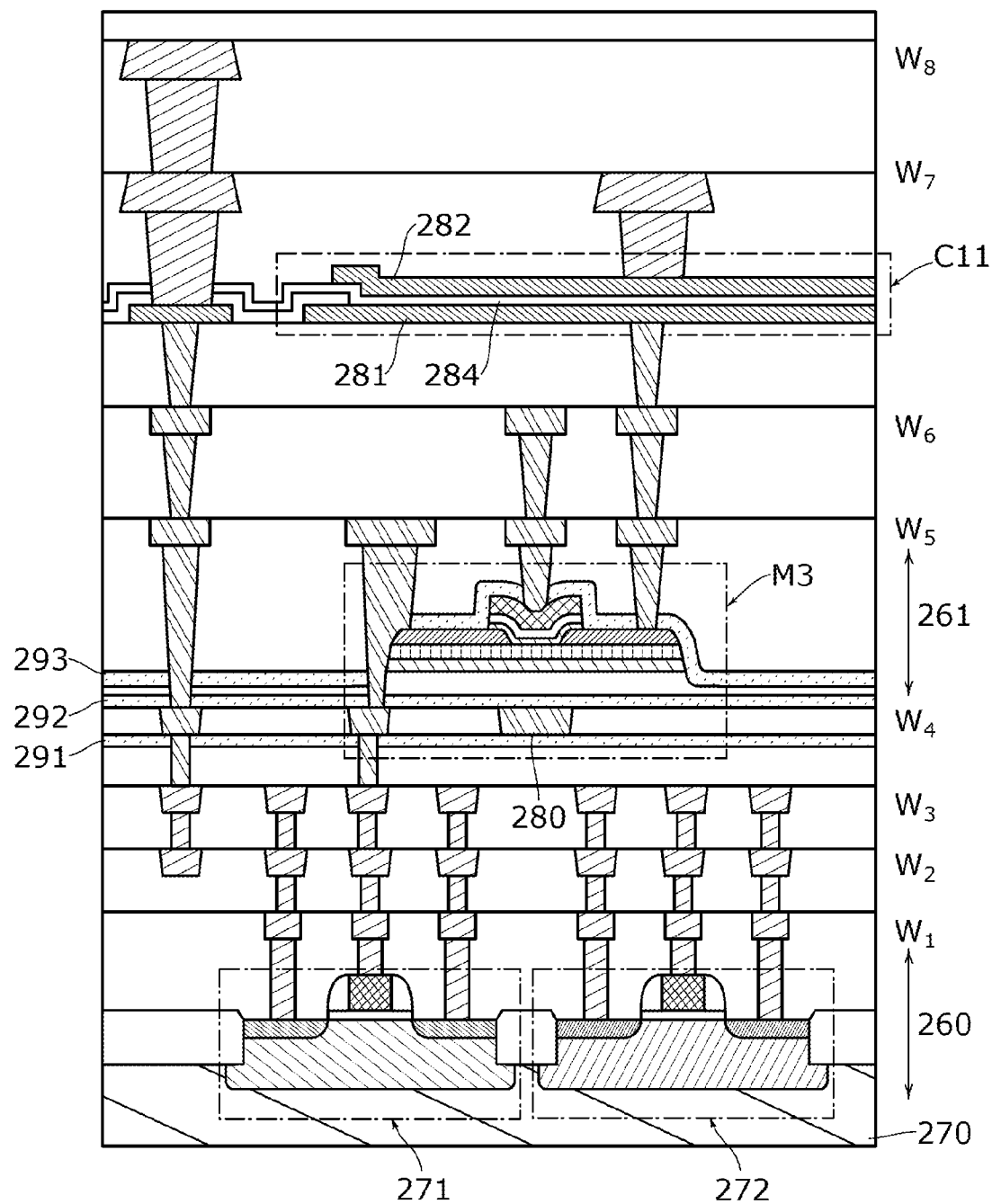
FIG. 22 is a cross-sectional view illustrating a structure example of a chip.

FIG. 22 illustrates a device structure example of a chip formed using OS transistors and Si transistors. FIG. 22 illustrates the layered structure of the PU 200 (FIG. 13) and specifically illustrates the layered structure of FIG. 14. Note that the PU 200 in FIG. 22 is not taken along a specific section line.

The chip is formed using a single crystal silicon wafer 270. The FET layer 260 includes semiconductor elements such as Si transistors and capacitors included in circuits except the circuit RC50. FIG. 22 typically illustrates a p-channel Si transistor 271 and an n-channel Si transistor 272. Wiring layers $W_1$ to $W_4$ are stacked over the FET layer 260. An FET layer 261 is stacked over the wiring layer $W_4$.

OS transistors are formed in the FET layer 261, and the transistors M1 to M3 are formed. The transistor M3 is typically illustrated. The transistors M1 and M2 have similar device structures. Here, the structures of the transistors M1 to M3 are similar to that of the OS transistor 504 (FIG. 20C). In order that the transistor M3 includes the back gate, a conductive layer 280 is formed in the wiring layer $W_4$.

Wiring layers $W_5$ and $W_6$ are stacked over the FET layer 261, the capacitor C11 is stacked over the wiring layer $W_6$, and wiring layers $W_7$ and $W_8$ are stacked over the capacitor C11. The capacitor C11 includes conductive layers 281 and 282 and an insulating layer 284. Here, a layer in which the conductive layer 281 is formed is used as a wiring layer. When the capacitor C11 is stacked over the FET layer 261, the capacitance of the capacitor C11 is increased easily. Although it depends on the capacitance of the capacitor C11, the capacitor C11 can be provided in the FET layer 261. In that case, a conductive layer that is in the same layer as the source electrode and the drain electrode of the transistor M3 and a conductive layer that is in the same layer as the gate electrode of the transistor M3 may form two electrodes.

When the capacitor C11 is provided in the FET layer 261, the number of processes can be reduced; thus, manufacturing cost is reduced.

<Chip Device Structure Example 2>

Figure 23:
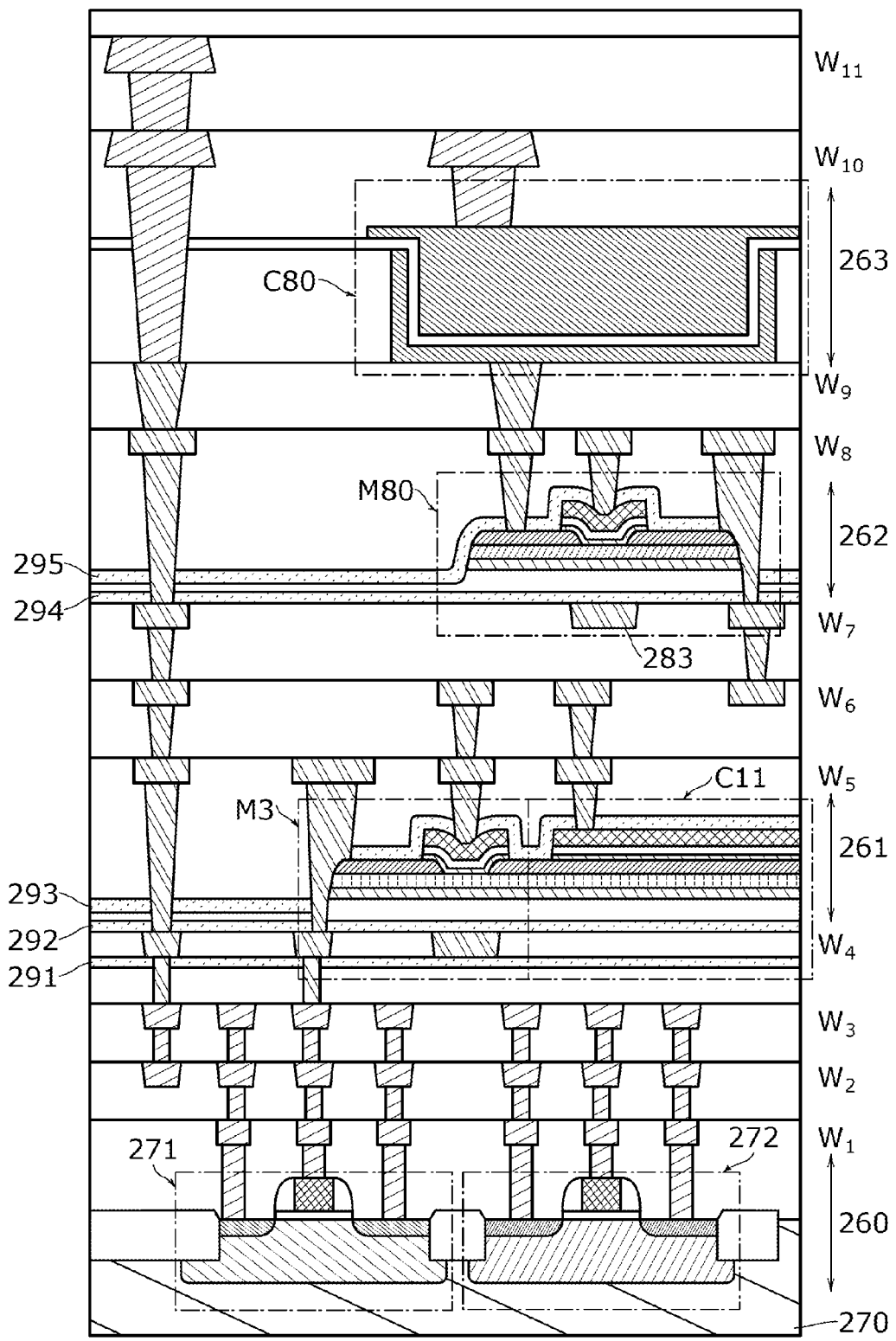
FIG. 23 is a cross-sectional view illustrating a structure example of a chip.

Another FET layer in which the OS transistor is formed can be stacked over the FET layer 261. FIG. 23 illustrates an example of a chip with such a 3D device structure.

In the chip of FIG. 23, the capacitor C11 is formed in the FET layer 261. Wiring layers $W_6$ and $W_7$ are stacked over the FET layer 261. An FET layer 262 is stacked over the wiring layer $W_7$. An OS transistor is formed in the FET layer 262. Here, a transistor M80 is illustrated. In order that the transistor M80 includes a back gate, a conductive layer 283 is formed in the wiring layer $W_7$.

Wiring layers $W_8$ and $W_9$ are stacked over the FET layer 262. A capacitor layer 263 is stacked over the wiring layer $W_9$. Wiring layers $W_{10}$ and $W_{11}$ are stacked over the capacitor layer 263. A plurality of capacitors C80 are provided in the capacitor layer 263. For example, the transistor M80 and the capacitor C11 can form a 1T1C memory cell. Thus, a memory cell array can be stacked over the FET layer 261.

Furthermore, the OS transistor of the FET layer 261 and the OS transistor of the FET layer 262 can have different electrical characteristics. For example, second oxide semiconductor layers of the OS transistors may be different from each other. In the case where the second oxide semiconductor layers are In—Ga—Zn oxides deposited by sputtering, targets with different atomic ratios of In:Ga:Zn may be used. For example, a target with an atomic ratio of In:Ga:Zn=1:1:1 is used for the transistor M3, and a target with an atomic ratio of In:Ga:Zn=4:2:4.1 is used for the transistor M80. The content of In is increased in the oxide semiconductor layer of the transistor M80; thus, the mobility of the transistor M80 can be increased. On the other hand, the content of In is decreased in the oxide semiconductor layer of the transistor M3; thus, the mobility of the transistor M3 becomes lower than that of the transistor M80 but the off-state current of the transistor M3 becomes lower than that of the transistor M80.

An insulator containing one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used as an insulator used for the chip in FIG. 22 or FIG. 23. Alternatively, a resin such as a polyimide resin, a polyamide resin, an acrylic resin, a siloxane resin, an epoxy resin, or a phenol resin can be used for the insulator. In this specification, an oxynitride refers to a substance that includes more oxygen than nitrogen, and a nitride oxide refers to a substance that includes more nitrogen than oxygen.

Insulating layers 291 to 295 preferably include at least one layer formed using an insulator having a blocking effect against hydrogen, water, and the like. Water, hydrogen, and the like are factors in causing carriers in the oxide semiconductor; thus, when a blocking layer against hydrogen, water, and the like is provided, the reliability of the transistor M3 can be improved. As the insulator having a blocking effect against hydrogen, water, and the like, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used, for example.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

In this specification, the term "parallel" indicates that the angle formed between two straight lines is greater than or equal to $-10°$ and less than or equal to $10°$, and accordingly includes the case where the angle is greater than or equal to $-5°$ and less than or equal to $5°$. The term "substantially parallel" indicates that an angle formed between two straight lines is greater than or equal to $-30°$ and less than or equal to $30°$. The term "perpendicular" indicates that an angle formed between two straight lines is greater than or equal to $80°$ and less than or equal to $100°$, and accordingly includes the case where the angle is greater than or equal to $85°$ and less than or equal to $95°$. The term "substantially perpendicular" indicates that an angle formed between two straight lines is greater than or equal to $60°$ and less than or equal to $120°$. In this specification, the trigonal and rhombohedral crystal systems are included in the hexagonal crystal system.

<CAAC-OS>

A CAAC-OS can be referred to as an oxide semiconductor including c-axis aligned nanocrystals (CANC). The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

In structural analysis of the CAAC-OS by an out-of-plane method, another peak might appear when $2\theta$ is around $36°$, in addition to the peak at $2\theta$ of around $31°$. The peak of $2\theta$ at around $36°$ indicates that a crystal having no c-axis alignment is included in part of the CAAC-OS. It is preferable that in the CAAC-OS analyzed by an out-of-plane method, a peak appear when $2\theta$ is around $31°$ and that a peak not appear when $2\theta$ is around $36°$.

On the other hand, in structural analysis of the CAAC-OS by an in-plane method in which an X-ray is incident on a sample in a direction substantially perpendicular to the c-axis, a peak appears when $2\theta$ is around $56°$. This peak is derived from the (110) plane of the InGaZnO$_4$ crystal. In the case of the CAAC-OS, when analysis ($\phi$ scan) is performed with $2\theta$ fixed at around $56°$ and with the sample rotated using a normal vector of the sample surface as an axis ($\phi$ axis), a peak is not clearly observed. In contrast, in the case of a single crystal oxide semiconductor of InGaZnO$_4$, when $\phi$ scan is performed with $2\theta$ fixed at around $56°$, six peaks which are derived from crystal planes equivalent to the (110) plane are observed. Accordingly, the structural analysis using XRD shows that the directions of a-axes and b-axes are irregularly oriented in the CAAC-OS.

The CAAC-OS is an oxide semiconductor having low density of defect states. Defects in the oxide semiconductor are, for example, a defect due to impurity and oxygen vacancies. Therefore, the CAAC-OS can be regarded as an oxide semiconductor with low impurity concentration, or an oxide semiconductor having a small number of oxygen vacancies. The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of atomic arrangement and lower crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having low density of defect states (a small number of oxygen vacancies) can have low carrier density. Such an oxide semiconductor is referred to as a highly purified intrinsic or substantially highly purified intrinsic oxide semiconductor. A CAAC-OS has low impurity concentration and low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. Therefore, the transistor including the CAAC-OS has small variation in electrical characteristics and high reliability. Since the CAAC-OS has low density of defect states, carriers generated by light irradiation or the like are less likely to be trapped in defect states. Therefore, in a transistor using the CAAC-OS, change in electrical characteristics due to irradiation with visible light or ultraviolet light is small.

Charge trapped by the carrier traps in the oxide semiconductor takes a long time to be released. The trapped charge may behave like fixed charge. Thus, the transistor that includes the oxide semiconductor having high impurity concentration and high density of defect states might have unstable electrical characteristics.

<Microcrystalline Oxide Semiconductor>

A microcrystalline oxide semiconductor has a region in which a crystal part is observed and a region in which a crystal part is not observed clearly in a high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal. An oxide semiconductor including nanocrystal is referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the nc-OS. Thus, the orientation of the whole film is not observed. Accordingly, in some cases, the nc-OS cannot be distinguished from an amorphous oxide semiconductor depending on an analysis method. For example, when the nc-OS is subjected to structural analysis by an out-of-plane method with an XRD apparatus using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. A plurality of spots are shown in a ring-like region in some cases.

Since there is no regularity of crystal orientation between the pellets (nanocrystals) as described above, the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS is likely to have lower density of defect states than an amorphous oxide semiconductor. Note that there is no regularity of crystal orientation between different pellets in the nc-OS. Therefore, the nc-OS has higher density of defect states than the CAAC-OS.

<Amorphous Oxide Semiconductor>

The amorphous oxide semiconductor is an oxide semiconductor having disordered atomic arrangement and no crystal part. For example, the amorphous oxide semiconductor does not have a specific state as in quartz. In a high-resolution TEM image of the amorphous oxide semiconductor, crystal parts cannot be found. When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which does not have long-range ordering but might have ordering in a range from an atom to the nearest neighbor atoms or to the second-nearest neighbor atoms is also called an amorphous structure in some cases. Therefore, the strictest definition does not permit an oxide semiconductor to be called an amorphous oxide semiconductor as long as even a negligible degree of ordering is present in atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void is observed in some cases. Furthermore, in the high-resolution TEM image, there are a region where a crystal part is clearly observed and a region where a crystal part is not observed. The a-like OS has an unstable structure because it contains a void. The a-like OS has lower density than the nc-OS and the CAAC-OS because it contains a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of a single crystal oxide semiconductor having the same composition. It is difficult to deposit an oxide semiconductor having a density of lower than 78% of the density of a single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Single crystals with the same composition do not exist in some cases. In that case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. It is preferable to combine as few kinds of single crystals as possible for density calculation.

Oxide semiconductors have various structures and various properties. A semiconductor region of an OS transistor may be a stacked film including two or more of an amorphous oxide semiconductor, an a-like OS, a microcrystalline oxide semiconductor, and a CAAC-OS, for example.

REFERENCE NUMERALS

10: circuit, 11: scan flip-flop (SFF), 15: circuit, 20: selection circuit, 21: selection circuit (SEL), 30: circuit, 31: flip-flop (FF), 31a: circuit, 32M: latch, 32S: latch, 42: inverter, 43: inverter, 44: inverter, 45: buffer (BUF), 50: SFF, 100: logic circuit, 101: logic circuit, 102: logic circuit, 103: logic circuit, 110: SFF, 112: SFF, 113: SFF, 114: SFF, 115: SFF, 116: SFF, 200: PU, 201: processor core, 202: power management unit (PMU), 203: power switch (PSW), 204: clock control circuit, 205: circuit, 210: power supply circuit, 220: terminal, 221: terminal, 222: terminal, 231: control unit, 232: program counter, 233: pipeline register, 234: pipeline register, 235: register file, 236: arithmetic and logic unit (ALU), 237: data bus, 240: logic circuit, 250: SFF, 260: FET layer, 261: FET layer, 262: FET layer, 263: capacitor layer, 270: single crystal silicon wafer, 271: p-channel Si transistor, 272: n-channel Si transistor, 280: conductive layer, 281: conductive layer, 282: conductive layer, 283: conductive layer, 284: insulating layer, 291: insulating layer, 292: insulating layer, 293: insulating layer, 294: insulating layer, 295: insulating layer, 501: OS transistor, 502: OS transistor, 503: OS transistor, 504: OS transistor, 505: OS transistor, 506: OS transistor, 510: substrate, 511: insulating layer, 512: insulating layer, 513: insulating layer, 514: insulating layer, 515: insulating layer, 520: OS layer, 521: OS layer, 522: OS layer, 523: OS layer, 530: conductive layer, 531: conductive layer, 541: conductive layer, 542: conductive layer, 551: layer, 552: layer, 900: portable game machine, 901: housing, 902: housing, 903: display portion, 904: display portion, 905: microphone, 906: speaker, 907: operation key, 908: stylus, 910: portable information terminal, 911: housing, 912: housing, 913: display portion, 914: display portion, 915: joint, 916: operation key, 920: laptop, 921: housing, 922: display portion, 923: keyboard, 924: pointing device, 930: electric refrigerator-freezer, 931: housing, 932: refrigerator door, 933: freezer door, 940: video camera, 941: housing, 942: housing, 943: display portion, 944: operation key, 945: lens, 946: joint, 950: motor vehicle, 951: car body, 952: wheel, 953: dashboard, 954: light, 7000: electronic component, 7001: lead, 7002: printed wiring board, 7003: circuit portion, 7004: circuit board, BK: terminal, C1: capacitor, C11: capacitor, C12: capacitor, C80: capacitor, CK: terminal, CK1: terminal, CKB1: terminal, D: terminal, D0: terminal, D1: terminal, D2: terminal, D3: terminal, Dn: terminal, EN: terminal, FN: node, FN11: node, M1: transistor, M2: transistor, M3: transistor, M80: transistor, OBG: terminal, PL: terminal, Q: terminal, QB: terminal, RC1: circuit, RC2: circuit, RC3: circuit, RC4: circuit, RC11: circuit, RC12: circuit, RC13: circuit, RC14: circuit, RC15: circuit, RC16: circuit, RC50: circuit, RE: terminal, RT: terminal, SD: terminal, SD_IN: terminal, SE: terminal, SW1: switch, SW2: switch, SW3: switch, T0: terminal, T1: terminal, T2: terminal, VH: terminal, VL: terminal, $W_1$: wiring layer, $W_2$: wiring layer, $W_3$: wiring layer, $W_4$: wiring layer, $W_5$: wiring layer, $W_6$: wiring layer, $W_7$: wiring layer, $W_8$: wiring layer, $W_9$: wiring layer, $W_{10}$: wiring layer, and $W_{11}$: wiring layer.

This application is based on Japanese Patent Application serial No. 2014-209506 filed with Japan Patent Office on Oct. 10, 2014, the entire contents of which are hereby incorporated by reference.

The invention claimed is:

1. A semiconductor device comprising:
a first transistor, a second transistor, a third transistor, a capacitor, a selection circuit and a memory circuit,
wherein a signal is input to one of a source and a drain of the first transistor,
wherein the other of the source and the drain of the first transistor is electrically connected to a first input terminal of the selection circuit,
wherein an output terminal of the selection circuit is electrically connected to an input terminal of the memory circuit,
wherein one of a source and a drain of the second transistor is electrically connected to the output terminal of the memory circuit,
wherein the other of the source and the drain of the second transistor is electrically connected to one terminal of the capacitor and one of a source and a drain of the third transistor,
wherein the other of the source and the drain of the third transistor is electrically connected to the first input terminal of the selection circuit, and wherein the second transistor and the third transistor each comprise an oxide semiconductor layer in a channel formation region.

2. The semiconductor device according to claim 1, wherein the first transistor comprises an oxide semiconductor layer in a channel formation region.

3. The semiconductor device according to claim 2, wherein the oxide semiconductor layers of the first to third transistors each include a c-axis aligned crystal.

4. The semiconductor device according to claim 1, wherein the capacitor and the first to third transistors are stacked over a region where the selection circuit is formed.

5. The semiconductor device according to claim 1, wherein a gate of the first transistor is electrically connected to a gate of the second transistor.

6. A semiconductor device comprising:
a first transistor, a second transistor, a third transistor, a capacitor and a flip-flop circuit,
wherein a signal is input to one of a source and a drain of the first transistor,
wherein the other of the source and the drain of the first transistor is electrically connected to a first input terminal of the flip-flop circuit,
wherein one of a source and a drain of the second transistor is electrically connected to an output terminal of the flip-flop circuit,
wherein the other of the source and the drain of the second transistor is electrically connected to one terminal of the capacitor and one of a source and a drain of the third transistor,
wherein the other of the source and the drain of the third transistor is electrically connected to the first input terminal of the flip-flop circuit, and
wherein the second transistor and the third transistor each comprise an oxide semiconductor layer in a channel formation region.

7. The semiconductor device according to claim 6, wherein the first transistor comprises an oxide semiconductor layer in a channel formation region.

8. The semiconductor device according to claim 7, wherein the oxide semiconductor layers of the first to third transistors each include a c-axis aligned crystal.

9. The semiconductor device according to claim 6, wherein the capacitor and the first to third transistors are stacked over a region where the flip-flop circuit is formed.

10. The semiconductor device according to claim 6, wherein a gate of the first transistor is electrically connected to a gate of the second transistor.

* * * * *